United States Patent
Tokorozuki et al.

(10) Patent No.: US 7,346,412 B2
(45) Date of Patent: Mar. 18, 2008

(54) MANUFACTURING METHOD OF SEMICONDUCTOR INTEGRATED CIRCUIT DEVICE

(75) Inventors: Kazuyuki Tokorozuki, Tokyo (JP);
Toshihiro Nakajima, Tokyo (JP);
Yoshiyuki Miyamoto, Tokyo (JP);
Yoshio Fukayama, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 80 days.

(21) Appl. No.: 10/578,723

(22) PCT Filed: Oct. 26, 2004

(86) PCT No.: PCT/JP2004/015835

§ 371 (c)(1),
(2), (4) Date: May 10, 2006

(87) PCT Pub. No.: WO2005/045907

PCT Pub. Date: May 19, 2005

(65) Prior Publication Data

US 2007/0097763 A1    May 3, 2007

(30) Foreign Application Priority Data

Nov. 10, 2003   (JP) ............................. 2003-379981

(51) Int. Cl.
*G06F 19/00* (2006.01)
*G06F 15/00* (2006.01)
*G06F 17/30* (2006.01)
*G05B 13/02* (2006.01)

(52) U.S. Cl. .................... 700/110; 700/51; 700/121; 702/183; 707/1

(58) Field of Classification Search ............ 700/47, 700/49, 51, 108–110, 121; 702/182–185; 707/1

See application file for complete search history.

(56) References Cited

U.S. PATENT DOCUMENTS 5,923,553 A * 7/1999 Yi ............................. 700/110

(Continued)

FOREIGN PATENT DOCUMENTS

JP    09-129554    5/1997

(Continued)

OTHER PUBLICATIONS

International Search Report, for Application No. PCT/JP2004/015835, mailed Dec. 14, 2004.

(Continued)

*Primary Examiner*—Leo Picard
*Assistant Examiner*—Sean Shechtman
(74) *Attorney, Agent, or Firm*—Antonelli, Terry, Stout & Kraus, LLP.

(57) ABSTRACT

The invention intends to provide a manufacturing method of a semiconductor integrated circuit device, which can detect an off-specification faulty wafer in real time. An abnormality detection server stores apparatus log data outputted from semiconductor manufacturing apparatus that processes a semiconductor wafer in an apparatus log data memory. Thereafter, in a lot end signal receiver, when a lot end signal outputted from the semiconductor manufacturing apparatus is received, an abnormal data detector, after referencing an abnormality detection condition setting file stored in a first detection condition memory, based on the referenced content, judges whether there are abnormal data in the apparatus log data stored in the apparatus log data memory or not. Upon detecting an abnormality, a detection result is outputted to an engineer PC and an operator terminal unit.

1 Claim, 27 Drawing Sheets

U.S. PATENT DOCUMENTS 6,947,801 B2 * 9/2005 Lin et al. .................... 700/108
2002/0055194 A1 * 5/2002 Takanabe .................... 438/14

FOREIGN PATENT DOCUMENTS

| JP | 09-180976 | 7/1997 |
| JP | 10-275753 | 10/1998 |
| JP | 2000-269108 | 9/2000 |
| JP | 2002-149222 | 5/2002 |
| JP | 2002-515650 | 5/2002 |
| WO | WO 99/59200 | 11/1999 |

OTHER PUBLICATIONS

Chinese Official Action dated Jul. 27, 2007, for Application No. 200480033020.3.

* cited by examiner

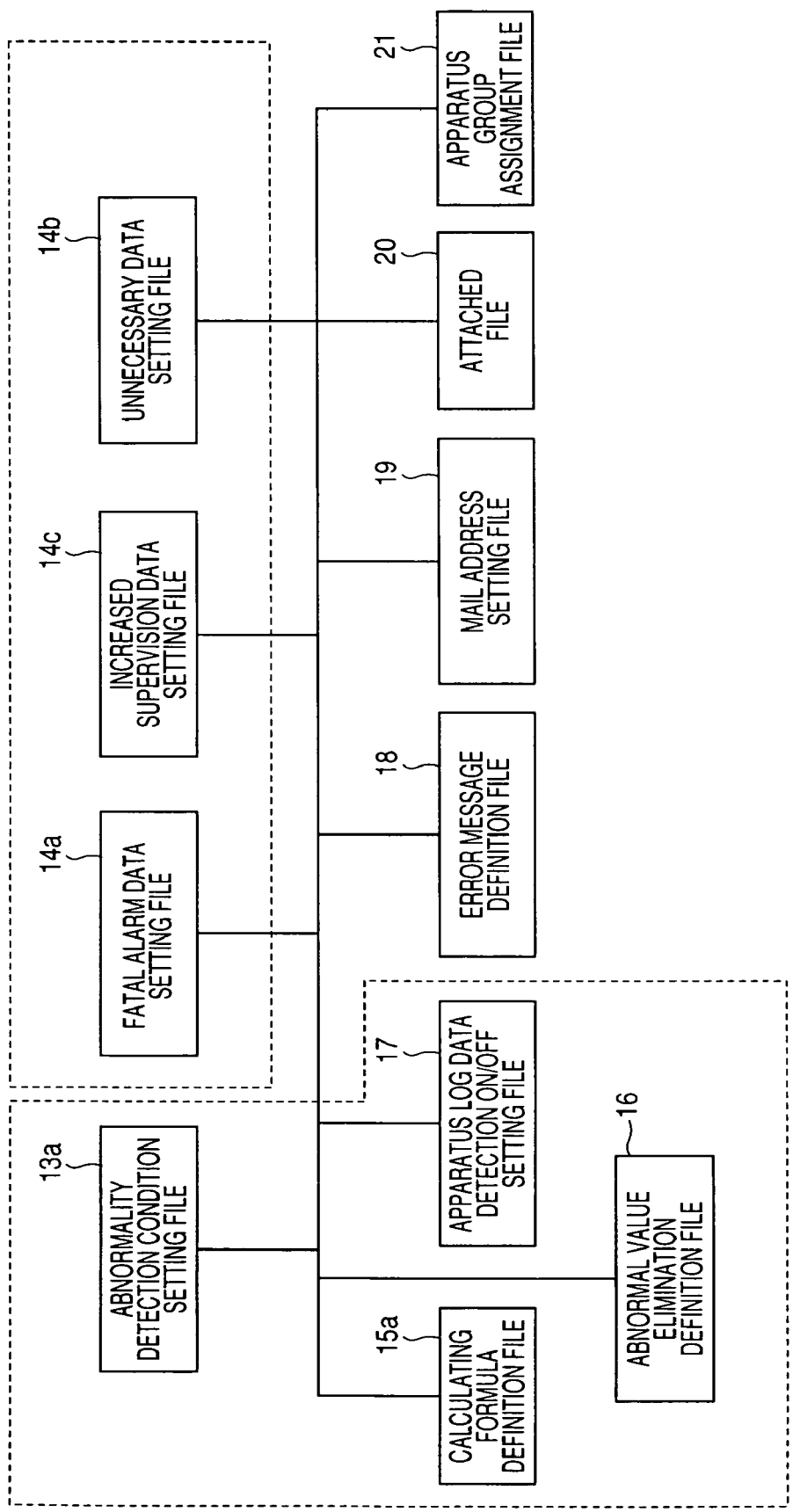

FIG. 8

| No | RECIPE No | | SEARCH KEY | | | | | | APPARATUS LOG DATA SETTING PORTION | | | |
|---|---|---|---|---|---|---|---|---|---|---|---|---|
| | SEARCH FOR | ELIMINATE | APPARATUS NAME SETTING KEY | SEARCH KEY | CHAMBER | STEP ID | PRODUCT NAME | PROCESS NAME | PARAMETER SETTING REFERENCE COLUMN | OPERATOR TERMINAL DISPLAY ON/OFF | MAILING ADDRESS | APPARATUS LOG DATA APPARATUS SIDE NAME |
| 1 | | | A | Key | | | Key | Key | | ON | ALL MEMBERS | G1 |
| 2 | | | A | Key | | | Key | Key | | ON | ALL MEMBERS | G2 |
| 3 | | | B | Key | | | Key | Key | | ON | ALL MEMBERS | G3 |
| 4 | | | B | Key | | | Key | Key | | ON | ALL MEMBERS | G4 |
| 5 | | | A-I | Key | | | Key | Key | | ON | ALL MEMBERS | G5 |
| 6 | | | A-KrF | Key | | | Key | Key | | ON | ALL MEMBERS | G6 |

| JUDGMENT METHOD | COMMON | | | | NUMBER OF SEARCH DATA | | σ ABNORMALITY JUDGMENT | | UPPER AND LOWER LIMIT VALUE JUDGMENT | | | WIDTH ABNORMALITY JUDGMENT | | REFERENCE COLUMN |
|---|---|---|---|---|---|---|---|---|---|---|---|---|---|---|
| | ERROR MESSAGE | ATTACHED FILE | RESET FLAG DURING APPARATUS MAINTENANCE | REGISTERED DATE | MINIMUM DATA NUMBER | MAXIMUM DATA NUMBER | JUDGMENT ON/OFF | σ COEFFICIENT | JUDGMENT ON/OFF | UPPER THRESHOLD VALUE | LOWER THRESHOLD VALUE | JUDGMENT ON/OFF | NORMAL WIDTH | |
| WITHIN LOT | 1 | 101 | | 2003/1/31 | 3 | 25 | ON | 3 | | | | | | |
| WITHIN LOT | 1 | 101 | | 2003/1/31 | 3 | 25 | ON | 3 | | | | | | |
| WITHIN LOT | 1 | | | 2003/1/31 | 3 | 25 | ON | 3 | | | | | | |
| WITHIN LOT | 1 | | | 2003/1/31 | 3 | 25 | ON | 3 | | | | | | |
| CONTINUOUS | 4 | | | 2003/1/31 | | | | | ON | 0.05 | 0.01 | | | |
| CONTINUOUS | 6 | | | 2003/1/31 | | | | | ON | 0.05 | 0.01 | | | |

FIG. 9

| APPARATUS NAME | SEMICON-DUCTOR MAKER | WAVE-LENGTH | APPARATUS GROUPING NAME ||||||
|---|---|---|---|---|---|---|---|---|
| | | | A | B | A-I | A-KrF | B-I | B-KrF |
| F-01 | A | I LINE | ○ | | ○ | | | |
| F-02 | A | I LINE | ○ | | ○ | | | |
| F-03 | A | I LINE | ○ | | ○ | | | |
| F-04 | A | I LINE | ○ | | ○ | | | |
| F-05 | A | I LINE | ○ | | ○ | | | |
| E-01 | A | KrF | ○ | | | ○ | | |
| E-02 | A | KrF | ○ | | | ○ | | |
| E-03 | A | KrF | ○ | | | ○ | | |
| E-04 | A | KrF | ○ | | | ○ | | |
| N-01 | B | I LINE | | ○ | | | ○ | |
| N-02 | B | I LINE | | ○ | | | ○ | |
| N-03 | B | I LINE | | ○ | | | ○ | |
| N-04 | B | I LINE | | ○ | | | ○ | |
| E-08 | B | KrF | | ○ | | | | ○ |
| E-09 | B | KrF | | ○ | | | | ○ |
| E-10 | B | KrF | | ○ | | | | ○ |
| E-11 | B | KrF | | ○ | | | | ○ |
| E-12 | B | KrF | | ○ | | | | ○ |

FIG. 10

| APPARATUS CODE | APPARATUS NAME | APPARATUS LOG DATA ||||||||||
|---|---|---|---|---|---|---|---|---|---|---|---|
| | | G1 | G2 | G3 | G4 | G5 | G6 | G7 | G8 | G9 | G10 |
| 24042 | F-01 | ON | ON | OFF | OFF | ON | ON | ON | ON | ON | ON |
| 2404L | F-02 | ON | ON | OFF | OFF | ON | ON | ON | ON | ON | ON |
| 2404M | F-03 | ON | ON | OFF | OFF | ON | ON | ON | ON | ON | ON |
| 2404N | F-04 | ON | ON | ON | ON | ON | ON | ON | ON | ON | ON |
| 2404O | F-05 | ON | OFF | ON | ON | OFF | OFF | OFF | ON | ON | ON |
| 2404H | E-01 | OFF | OFF | ON | ON | OFF | OFF | OFF | OFF | OFF | OFF |
| 2404D | E-02 | OFF | OFF | ON | ON | OFF | OFF | OFF | OFF | OFF | OFF |
| 2404E | E-03 | OFF | OFF | ON | ON | OFF | OFF | OFF | OFF | OFF | OFF |

FIG. 11

| KIND OF APPARATUS LOG DATA | PRODUCT | PROCESS | APPARATUS | LOWER LIMIT | UPPER LIMIT |
|---|---|---|---|---|---|
| GLOBAL ALIGNMENT MEASUREMENT SHIFT X | α | 1 | #1 | 0.1 | 0.5 |
| | | 2 | | 0 | 0.8 |
| | | 3 | | 0.4 | 1 |
| | | 4 | | 0.8 | 1.2 |
| | | 1 | #2 | 0.2 | 0.6 |
| | | 2 | | -0.5 | -0.3 |
| | | 3 | | 0.1 | 0.8 |
| | | 4 | | 1.2 | 1.8 |

FIG. 12

| KIND OF APPARATUS LOG DATA | PRODUCT NAME | PROCESS NAME | APPARATUS NAME | σ COEFFICIENT |
|---|---|---|---|---|
| GLOBAL ALIGNMENT MEASUREMENT SHIFT X | key | key | key | 3 |

FIG. 13

| HEADER OF APPARATUS LOG DATA |

PRODUCT NAME: α

PROCESS NAME: 3

APPARATUS NAME: #1

LOT No: G0001

RECIPE No: RESIST COATING

FIG. 14

| No | CONTENT OF DETECTION ITEM | CALCULATING FORMULA | PARAMETER P1 FOR CALCULATION | PARAMETER P2 FOR CALCULATION | PARAMETER P3 FOR CALCULATION | PARAMETER P4 FOR CALCULATION |
|---|---|---|---|---|---|---|
| 1 | PARAMETER Z | (Ch1+Ch4)/2-(Ch2+Ch5)/2 | Ch1 | Ch2 | Ch4 | Ch5 |

FIG. 15

| ERROR No | SUMMARY DISPLAY | CONTENT OF ERROR MESSAGE |
|---|---|---|
| 1 | ALIGNMENT ABNORMALITY | THERE IS AN ABNORMALITY IN AN ALIGNMENT MEASUREMENT RESULT. SINCE AN ALIGNMENT SHIFT MAY OCCUR, INSPECT ALIGNMENT OF AN ABNORMAL WAFER. SEND OUT WHEN THERE IS NO ABNORMALITY IN THE ALIGNMENT INSPECTION RESULT. FREQUENT OCCURRENCE REQUIRES A NOTIFICATION TO (MANUFACTURING TECHNOLOGY SECTION). |
| 2 | ALIGNMENT ABNORMALITY | THERE IS AN ABNORMALITY IN A BLC MEASUREMENT VALUE. SINCE AN ALIGNMENT SHIFT MAY OCCUR, INSPECT ALIGNMENT OF AN ABNORMAL LOT. WHEN A SHUTDOWN OR INITIALIZATION IS CAUSED DURING A PROCESS OF A LOT, INSPECT WAFERS BEFORE AND AFTER THAT. SEND OUT WHEN THERE IS NO ABNORMALITY IN THE ALIGNMENT INSPECTION RESULT. FREQUENT OCCURRENCE REQUIRES A NOTIFICATION TO (MANUFACTURING TECHNOLOGY SECTION). |
| 3 | FOCUS ABNORMALITY | THERE IS AN ABNORMALITY IN A FOCUS MEASUREMENT VALUE. SINCE A FOCUS SHIFT MAY OCCUR, CARRY OUT A DIMENSION INSPECTION AND FOCUS QC. WHEN A SHUTDOWN OR INITIALIZATION IS CAUSED DURING A PROCESS OF A LOT, INSPECT WAFERS BEFORE AND AFTER THAT. WRITE IN APPARATUS QC DATA IN A COMMENT COLUMN. FREQUENT OCCURRENCE REQUIRES A NOTIFICATION TO (MANUFACTURING TECHNOLOGY SECTION). |

FIG. 16

A STEPPER MEASUREMENT ABNORMALITY OCCURRED.
SINCE AN OFF-SPECIFICATION ALIGNMENT MAY OCCUR, CARRY OUT AN ALIGNMENT MEASUREMENT.
WRITE IN A CONCERNED PRODUCT IN A TABLE BELOW AND RETURN.

ATTACHED FILE No: 101

| LOT No | WAFER No | DETECTION ITEM | CONTENT OF OPERATION | | X DIRECTION | | | Y DIRECTION | | |
|---|---|---|---|---|---|---|---|---|---|---|
| | | | | | SPECIFICATION | MEASUREMENT RESULT | JUDGMENT RESULT | SPECIFICATION | MEASUREMENT RESULT | JUDGMENT RESULT |
| | | GLOBAL ALIGNMENT MEASUREMENT DATA | IMPLEMENTATION OF ALIGNMENT INSPECTION | UPPER LIMIT | | | | | | |
| | | | | LOWER LIMIT | | | | | | |

RETURN

FIG. 17

| No | FATAL ALARM DATA | INPUTTER | TERMINAL DISPLAY ON/OFF | MAIL ADDRESS | ALARM CONTENT | CONTENT OF ENGINEER'S INSTRUCTION |
|---|---|---|---|---|---|---|
| 1 | A0001 | | ON | ENGINEER | | |
| 2 | A0002 | | ON | ENGINEER | | |
| 3 | A0003 | | ON | ENGINEER | | |
| 4 | B0*** | | ON | ENGINEER | | |

FIG. 18

| No | UNNECESSARY DATA | INPUTTER |
|---|---|---|
| 1 | X0001 | |
| 2 | X0002 | |
| 3 | Y00** | |

FIG. 19

| No | INCREASED SUPERVISION DATA | SUPERVISION TIME | NUMBER OF TIMES | INPUTTER | TERMINAL DISPLAY ON/OFF | MAILING ADDRESS | CONTENT OF ENGINEER'S INSTRUCTION |
|---|---|---|---|---|---|---|---|
| 1 | Z0001 | 2 | 10 | | ON | ENGINEER | |
| 2 | Z0002 | 2 | 5 | | ON | ENGINEER | |
| 3 | DEFAULT | 1 | 10 | | ON | ENGINEER | |

FIG. 20

| ELEMENT | IMPLA |
|---|---|
| START TIME | 2003/1/10 10:10 |
| COMPLETION TIME | 2003/1/10 11:00 |
| PRODUCT NAME | A |
| PROCESS NAME | X |
| RECIPE NAME | A-X |
| APPARATUS NAME | HE-01 |
| LOT No | A0001 |
| CHAMBER NAME | |
| STEP NAME | |
| APPARATUS ERROR | YES |

| ERROR MESSAGE No | CONTENT OF ERROR MESSAGE | CHECK FILE | CONCERNED PRODUCT |
|---|---|---|---|
| 1 | A PRESSURE ABNORMALITY IS DETECTED. CONFIRM A CONTENT OF AN ATTACHED FILE AND SEND OUT THE LOT. | NONE | OPEN |
| 2 | AN INJECTION CURRENT ABNORMALITY IS DETECTED. CONFIRM A CONTENT OF AN ATTACHED FILE AND SEND OUT THE LOT. | YES | OPEN |

FIG. 21

| APPARATUS ERROR FILE | | |
|---|---|---|
| APPARATUS ERROR | OCCURRENCE TIME PERIOD | 15:30 |
| | WAFER No | 10 |
| | CODE | **-*** |
| | CONTENT | VACUUM PRESSURE ABNORMALITY |
| APPARATUS ERROR | OCCURRENCE TIME PERIOD | 15:40 |
| | WAFER No | 15 |
| | CODE | **-*** |
| | CONTENT | VACUUM PRESSURE ABNORMALITY |

FIG. 22

| LOT No | WAFER No | DETECTION ITEM | DETECTION METHOD |
|---|---|---|---|
| A001 | 1 | VACUUM PRESSURE | UPPER AND LOWER LIMIT VALUES |
| A001 | 5, 10 | INJECTION CURRENT | WIDTH JUDGMENT |

FIG. 23

| No | CONTENT OF CONFIRMATION | MANAGEMENT SPECIFICATION | | | MANAGEMENT VALUE | JUDGMENT |
|---|---|---|---|---|---|---|
| | | UNIT | LOWER LIMIT | UPPER LIMIT | | |
| 1 | VACUUM OF BEAM LINE (NO LOAD) | E-6Torr | – | 1.00 | 0.56 | OK |
| 2 | VACUUM OF BEAM LINE (WITH GATE VALVE OF CRYO CLOSED) | E-6Torr | 0.11 | – | | |
| 3 | VACUUM OF ANALYZER (WITH BEAM GATE IN UNDER NO LOAD) | E-6Torr | – | 1.00 | | |
| 4 | VACUUM OF ANALYZER (WITH BEAM GATE OUT UNDER NO LOAD) | E-6Torr | – | 1.00 | | |
| 5 | VACUUM OF BEAM LINE (DURING IMPLEMENTATION OF P-RS DUMMY INJECTION) | E-6Torr | – | 1.00 | | |
| | WHETHER ERROR OCCURRED OR NOT (DURING IMPLEMENTATION OF P-RS DUMMY INJECTION) | – | – | – | | |
| 6 | VACUUM OF BEAM LINE (DURING IMPLEMENTATION OF P-RS 30 DUMMY INJECTION) | E-6Torr | – | 1.00 | | |
| | WHETHER ERROR OCCURRED OR NOT (DURING IMPLEMENTATION OF P-RS DUMMY INJECTION) | – | – | – | | |

RETURN

FIG. 24

| CHECK BOX | OCCURRENCE TIME PERIOD | KIND OF ERROR | APPARATUS ALARM DATA | LOT No | WAFER No | CONTENT OF ALARM | ENGINEER'S INSTRUCTION |
|---|---|---|---|---|---|---|---|
| ☑ | 4/1 13:00 | FATAL ERROR | ***-*** | A0001 | 01 | VACUUM PRESSURE ABNORMALITY | STOP A UNIT AND NOTIFY TO (APPARATUS MANAGEMENT SECTION). STOP THE PRODUCT. |
| ☑ | 4/1 13:15 | FATAL ERROR | ***-*** | A0001 | 03 | VACUUM PRESSURE ABNORMALITY | STOP A UNIT AND NOTIFY TO (APPARATUS MANAGEMENT SECTION). STOP THE PRODUCT. |
| ☑ | 4/1 13:30 | FATAL ERROR | ***-*** | A0001 | 05 | VACUUM PRESSURE ABNORMALITY | STOP A UNIT AND NOTIFY TO (APPARATUS MANAGEMENT SECTION). STOP THE PRODUCT. |
| ☐ | 4/1 13:45 | FATAL ERROR | ***-*** | A0001 | 10 | CURRENT VALUE ABNORMALITY | STOP A UNIT AND NOTIFY TO AN ENGINEER. |
| ☐ | 4/1 14:30 | ABNORMALITY IN NUMBER OF TIMES | ***-*** | A0001 | 20 | GAS FLOW RATE ABNORMALITY | THE ERROR OCCURS FREQUENCY. STOP A UNIT AND NOTIFY TO (APPARATUS MANAGEMENT SECTION). |

RETURN

FIG. 25

| TRANSMISSION | OCCURRENCE TIME PERIOD | LOT No | WAFER No | CONTENT OF ALARM | LINE COMMENT INPUT COLUMN |
|---|---|---|---|---|---|
| ☑ | 4/1 13:00 | A0001 | 01 | VACUUM PRESSURE ABNORMALITY | THERE IS NO PROBLEM OF CHECK POINTS OF A VALVE AND VACUUM GAUGE. STAFFS AGREE FLOWING PRODUCTS. |
| ☑ | 4/1 13:15 | A0001 | 03 | VACUUM PRESSURE ABNORMALITY | THERE IS NO PROBLEM OF CHECK POINTS OF A VALVE AND VACUUM GAUGE. STAFFS AGREE FLOWING PRODUCTS. |
| ☑ | 4/1 13:30 | A0001 | 05 | VACUUM PRESSURE ABNORMALITY | THERE IS NO PROBLEM OF CHECK POINTS OF A VALVE AND VACUUM GAUGE. STAFFS AGREE FLOWING PRODUCTS. |

[ INPUT END ]

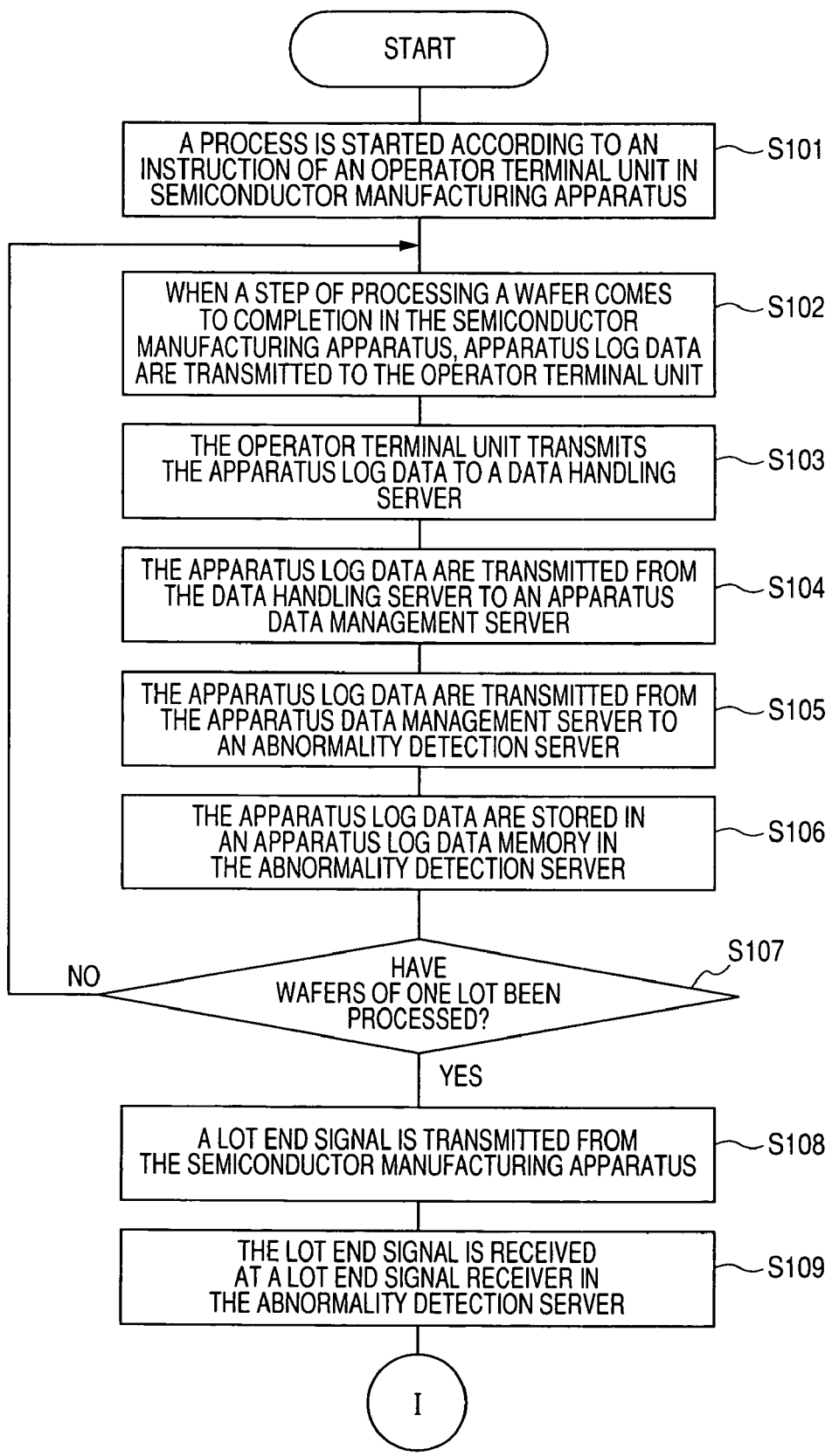

MANUFACTURING METHOD OF SEMICONDUCTOR INTEGRATED CIRCUIT DEVICE

BACKGROUND OF THE INVENTION

1. Field of the Invention

The invention relates to a manufacturing technology of a semiconductor integrated circuit device, in particular, a technology that is effectively applied to a manufacturing technology of a semiconductor integrated circuit device, which detects a defect of a semiconductor wafer.

2. Description of the Related Art

In JP-A-2000-269108, a technology where a sensor is attached to semiconductor manufacturing apparatus and with waveform data of the attached sensor an abnormality in a process line is detected is disclosed.

Furthermore, in JP-T-2002-515650, a technology where by use of defect information of a semiconductor wafer the yield is improved is disclosed.

A semiconductor product is formed by repeatedly applying a layering process and a patterning process that uses a photolithography technology and an etching technology to a semiconductor wafer (hereinafter, referred to as wafer). Until a semiconductor product comes to completion, though different depending on products, 1000 to 2000 processes are necessary in total.

The wafers that are processed according to the respective processes such as the layering process and the patterning process are managed with a block of 25 wafers as one lot in a mass production factory of normal semiconductor products. In the respective processes, whether the wafer satisfies specifications determined so that semiconductor products that become complete products may operate as designed or not is checked.

However, as mentioned above, until a semiconductor product comes to completion, very many processes have to be passed. Accordingly, for instance, when all wafers in one lot are inspected (total inspection), the number of necessary inspection devices becomes huge, resulting in huge investment and a very long TAT (Turn Around Time) that is a time from an order reception from a customer to a product supply thereto. Accordingly, in the inspection, not the total inspection but the sampling inspection is carried out.

The specifications used in the sampling inspection of the respective processes are determined considering the dispersion of the respective wafers. When the wafers are subjected to the sampling inspection and found satisfying the specifications, defective products due to the process are not fundamentally generated.

However, when trouble of the semiconductor manufacturing apparatus or process abnormality occurs, off-specification wafers are generated in the lot. In particular, when the frequency of the off-specification wafers is low, the sampling inspection is very low in the detection probability and takes a very long time to detect. Accordingly, there is a problem in that off-specification faulty wafers are produced much.

An object of the invention is to provide a manufacturing method of a semiconductor integrated circuit device, which can detect in real-time an off-specification faulty wafer.

Furthermore, another object of the invention is to provide a manufacturing method of a semiconductor integrated circuit device that without taking much trouble of an engineer can efficiently detect an off-specification faulty wafer.

The foregoing and other objects of the invention and novel features thereof will be clarified from descriptions of the specification and attached drawings.

SUMMARY OF THE INVENTION

Among inventions disclosed in the application, typical ones are briefly summarized as follows.

A manufacturing method of a semiconductor integrated circuit device according to the invention includes (a) storing apparatus log data that are data outputted from a semiconductor manufacturing apparatus that processes a semiconductor wafer and show a state of the semiconductor manufacturing apparatus in a apparatus log data memory, (b) detecting whether there is abnormal data in the apparatus log data stored in the apparatus log data memory or not at an abnormal data detector, and (c) outputting a result detected at the abnormal data detector to a result outputting portion.

Another manufacturing method of a semiconductor integrated circuit device according to the invention includes (a) outputting an average value of a reflection wave of a matcher from a semiconductor manufacturing apparatus that forms a film on a semiconductor wafer and has a high frequency power source that applies a high frequency electric field into a chamber and the matcher connected to the high frequency power source to store in an apparatus log data memory, (b) detecting at an abnormal data detector whether there is one that is larger than a predetermined value among the average values of reflection wave stored in the apparatus log data memory or not and (c) outputting a result detected at the abnormal data detector to a result output portion.

Still another manufacturing method of a semiconductor integrated circuit device according to the invention includes (a) outputting an aperture of a valve from a semiconductor manufacturing apparatus that applies the etching and has the valve for controlling pressure inside of an etching chamber to store in a apparatus log data memory, (b) detecting at an abnormal data detector whether there is one that is larger than a predetermined value among the apertures stored in the apparatus log data memory or not and (c) outputting a result detected at the abnormal data detector to a result output portion.

Another manufacturing method of a semiconductor integrated circuit device according to the invention includes (a) outputting, from an exposure unit, alignment measurement data that are used to align a semiconductor wafer to store in a apparatus log data memory, (b) detecting, at an abnormal data detector, whether there is one that is larger than a predetermined value among the alignment measurement data stored in the apparatus log data memory or not and (c) outputting a result detected at the abnormal data detector to a result output portion.

Still another manufacturing method of a semiconductor integrated circuit device according to the invention includes, in a manufacturing method of a semiconductor integrated circuit device where a wafer is processed with semiconductor manufacturing apparatus including a functional portion (for instance, matcher) having a parameter that enters in a faulty region after variously varying through complicated processes (for instance, before a parameter enters a faulty region, a plurality of maximums or minimums is passed), continuously, periodically, intermittently or at random supervising (observing) the parameter to notify, before an interlock mechanism starts operating to result in adversely affecting on the wafer, that an operational fault of the functional portion is near to occur and thereby to inhibit the operational fault of the parameter of the functional portion from occurring during processing the wafer.

Another manufacturing method of a semiconductor integrated circuit device according to the invention includes, in a manufacturing method of a semiconductor integrated circuit device, which uses semiconductor manufacturing apparatus (such as heating, thermal oxidizing, annealing and CVD devices) that processes a wafer by lamp heating, in order to inhibit an undesired component (such as gold plating) from dissipating (vaporization, scattering and sublimation) from a periphery of a lamp, which is heated owing to undesired heating of the lamp, continuously, periodically, intermittently or at random supervising the lamp output to process the wafer.

Advantages obtained by typical ones of the inventions disclosed in the application can be briefly summarized as follows.

An off-specification faulty wafer can be detected in real time. Furthermore, the off-specification faulty wafer can be efficiently detected without causing trouble on an engineer.

BRIEF DESCRIPTION OF THE DRAWINGS

FIG. 7 is a diagram showing a relationship between an abnormality detection condition setting file, a fatal alarm data setting file, an unnecessary data setting file and an increased supervision data setting file and a file present in an underlayer thereof.

FIG. 8 is a diagram showing a content of the abnormality detection condition setting file.

FIG. 9 is a diagram showing a content of an apparatus group assignment file.

FIG. 10 is a diagram showing a content of an apparatus log data detection ON-OFF setting file.

FIG. 11 is a diagram showing an example of setting upper and lower limit values.

FIG. 12 is a diagram describing only items of detection keys, kind of the apparatus log data and a σ coefficient set among the abnormality detection condition setting file.

FIG. 13 is a diagram showing a content of a header of apparatus log data.

FIG. 14 is a diagram showing a content of a calculating formula definition file.

FIG. 15 is a diagram showing a content of an error message definition file.

FIG. 16 is a diagram showing a content of an attached file.

FIG. 17 is a diagram showing a content of a fatal alarm data setting file.

FIG. 18 is a diagram showing a content of a unnecessary data setting file.

FIG. 19 is a diagram showing a content of an increased supervision data setting file.

FIG. 20 is a diagram showing an output content of a detection result.

FIG. 21 is a diagram showing an output content of a detection result.

FIG. 22 is a diagram showing an output content of a detection result.

FIG. 23 is a diagram showing a content of an attached file.

FIG. 24 is a diagram showing an output content of a detection result.

FIG. 25 is a diagram showing an output content of a detection result.

FIG. 26 is a flow chart explaining an operation of detecting an abnormality by use of the apparatus log data.

DESCRIPTION OF THE PREFERRED EMBODIMENTS

Figure 1:
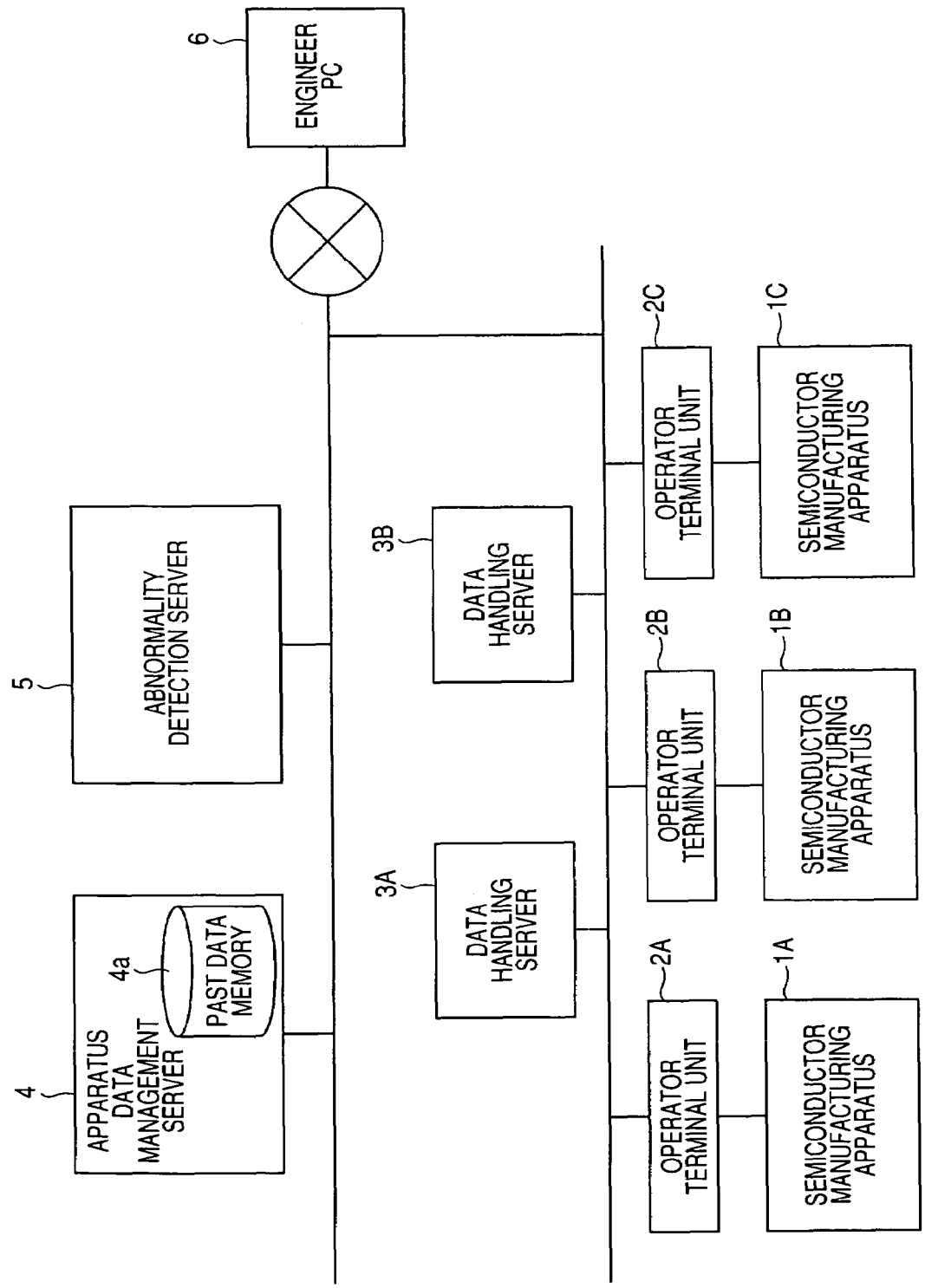
FIG. 1 is a diagram showing a configuration of an abnormality detection system in an embodiment 1 according to the invention.

Before the invention of the application is detailed, meanings of terms in the application are explained as follows.

1. A semiconductor wafer means an insulating, semi-insulating or semiconductive substrate such as a silicon single crystal substrate (generally substantially flat circular shape), a sapphire substrate, a glass substrate and other and composite substrates thereof that are used in the manufacture of an integrated circuit. Furthermore, a semiconductor integrated circuit device in the application includes not only one formed on a semiconductive or insulating substrate such as a silicon wafer or a sapphire substrate but also, unless clearly stated otherwise, one that is formed on other insulating substrate such as glass like a TFT (Thin-Film-Transistor) and STN (Super-Twisted-Nematic) liquid crystal.

2. Apparatus log data are data outputted from semiconductor manufacturing apparatus and mean data showing a state of the semiconductor manufacturing apparatus or data generated by applying a calculation to data showing a state of the semiconductor manufacturing apparatus.

3. Past data are data stored in an apparatus data management server and mean apparatus log data that have been judged as abnormal in the past.

4. Apparatus alarm data are data outputted from the semiconductor manufacturing apparatus and mean data that show an abnormality of the semiconductor manufacturing apparatus.

5. Fatal alarm data mean, among the apparatus alarm data, data showing a fatal abnormality when a semiconductor wafer is processed.

6. Increased supervision data mean, among the apparatus alarm data, data that supervise more than how many times the semiconductor manufacturing apparatus output in a definite time.

Embodiments below, as needs arise for convenience' sake, will be described divided into a plurality of sections or embodiments. However, unless clearly stated otherwise, these are not independent from each other but in the relationship where one is a part of the other or a modification example, a detailed explanation or a complementing explanation of all.

Furthermore, in the embodiments below, when referring to the number of elements (pieces, numeral values, amounts and ranges), except a case where the number is clearly mentioned and a case where the number is obviously restricted in principle to a particular number, the number thereof is not restricted to particular number and may be more than or less than the particular number.

Still furthermore, in the embodiments below, it goes without saying that the constituent elements (including elementary steps), except a case where the number is clearly mentioned and a case where the number is considered obviously indispensable in principle, are not necessarily indispensable ones.

Similarly, in the embodiments below, when referring to shapes of constituent elements and a positional relationship thereof, except a case where the shape is clearly mentioned and a case where the shape is considered in principle obviously not so, ones that are substantially similar to or resemble the shape are contained. This is same as to the numeral values and the ranges.

Furthermore, in all drawings for explaining the embodiments, like numbers reference like members as a rule and repetition of the explanation thereof is omitted.

In what follows, embodiments according to the invention will be detailed with reference to the drawings.

(Embodiment 1)

In an embodiment 1, a manufacturing method of a semiconductor integrated circuit device when semiconductor manufacturing apparatus is connected to an abnormality detection system is explained.

FIG. 1 is a functional block diagram showing an abnormality detection system used in a manufacturing method of a semiconductor integrated circuit device in embodiment 1.

In FIG. 1, an abnormality detection system in the embodiment 1 includes semiconductor manufacturing apparatuses 1A through 1C, operator terminal units 2A through 2C, data handling servers 3A and 3B, an apparatus data management server 4, an abnormality detection server 5 and an engineer PC (Personal Computer) 6.

The semiconductor manufacturing apparatuses 1A through 1C, respectively, are electrically connected to the operator terminal units 2A through 2C. Furthermore, the operator terminal units 2A through 2C, the data handling servers 3A and 3B, the apparatus data management server 4 and the abnormality detection server 5 are mutually connected through a LAN (Local Area Network). Still furthermore, the engineer PC 6 may be connected to the LAN or may be connected through the Internet.

In FIG. 1, a state where a wire LAN is used to connect is shown. However, without restricting thereto, a wireless LAN may be used to connect and the Internet may be used to interconnect therebetween. Furthermore, in FIG. 1, an example where three semiconductor manufacturing apparatuses 1A through 1C are connected is shown. However, without restricting thereto, the number of the apparatus may be increased or decreased.

The semiconductor manufacturing apparatuses 1A through 1C are apparatus for processing a wafer to form a semiconductor device on the wafer and constituted of, for instance, a CVD (Chemical Vapor Deposition) unit for depositing a film on a wafer, a sputtering unit, an ion implanting unit for implanting an ion that is an impurity in the wafer, a coating and developing unit for coating a resist film on the wafer followed by developing, an exposure unit forming a circuit pattern on the wafer thereon the resist film is formed and an etching unit that etches the film formed on the wafer.

The semiconductor manufacturing apparatuses 1A through 1C each are apparatus that takes out one wafer at a time from one lot made of one block of 25 wafers to process and periodically outputs apparatus log data (parameter) that show a state of the apparatus to operator terminal units 2A through 2C. Furthermore, the semiconductor manufacturing apparatuses 1A through 1C, when an abnormality occurs to the semiconductor manufacturing apparatuses 1A through 1C, output apparatus alarm data that show the abnormality of the apparatus to the operator terminal units 2A through 2C. Still furthermore, the semiconductor manufacturing apparatuses 1A through 1C each, when the processing of one lot of wafers comes to completion, output a lot end signal (end signal). The apparatus log data are not only outputted periodically but also may be outputted continuously, intermittently or at random from the semiconductor manufacturing apparatuses 1A through 1C.

The apparatus log data are constituted of, for instance, a plurality of header portions and body portions. In the header portion, data such as a product name when the process comes to completion, a name of a step in process, a processing condition and a name of semiconductor manufacturing apparatus in process are written in. On the other hand, in the body portion thereof, data of measurements are written in.

As specific apparatus log data, though different depending on the kind of the semiconductor manufacturing apparatus, when the semiconductor manufacturing apparatus is, for instance, an exposure unit, alignment measurement data that are a result of measurement of a global alignment process where a misalignment of a wafer is automatically measured and corrected and focus correction data can be cited. Furthermore, when the semiconductor manufacturing apparatus is a CVD unit, gas flow rate data and stage temperature data can be cited. Still furthermore, when the semiconductor manufacturing apparatus is a vacuum unit, vacuum pressure data and aperture data that show an aperture of an APC (Auto Pressure Control) valve can be cited.

In the next place, the operator terminal units 2A through 2C each become an interface between an operator and each of the semiconductor manufacturing apparatuses 1A through 1C and are disposed so that the operator can control the semiconductor manufacturing apparatuses 1A through 1C. For instance, the operator terminal units 2A through 2C each work as an interface that outputs the apparatus log data and the apparatus alarm data outputted from the semiconductor manufacturing apparatuses 1A through 1C to the data handling servers 3A and 3B. Furthermore, the operator terminal units 2A through 2C can download the processing conditions and instruct a start of the processing to the semiconductor manufacturing apparatuses 1A through 1C.

The data handling servers 3A and 3B each control the apparatus log data and the apparatus alarm data outputted through the operator terminal units 2A through 2C from the semiconductor manufacturing apparatuses 1A through 1C so as to be able to efficiently output data to an apparatus data management server 4. Furthermore, the data handling servers 3A and 3B, in order to improve the reliability in the data collection of the apparatus data management server 4, when the apparatus data management server 4 comes down, can temporarily store the apparatus log data and the apparatus alarm data that could not be outputted. The data handling servers 3A and 3B are constituted so that, after the apparatus data management server 4 comes back, the data that could not be outputted may be collectively outputted.

The apparatus data management server 4 is a database that intends to store the apparatus log data and the apparatus alarm data and has a past data memory 4a that store the apparatus log data (past data) of which abnormality has been detected at the abnormality detection server 5. Furthermore, the apparatus data management server 4 is constituted so as to output the apparatus log data and the apparatus alarm data inputted from the data handling servers 3A and 3B to the abnormality detection server 5. The apparatus data management server 4 stores the apparatus log data that are a target to be detected of whether there is an abnormality or not.

The abnormality detection server 5 can temporarily store the apparatus log data and the apparatus alarm data inputted from the apparatus data management server 4 and can receive a lot end signal outputted from the semiconductor manufacturing apparatuses 1A through 1C. The abnormality detection server 5, upon receiving the lot end signal, detects whether there are abnormality data in the temporarily stored apparatus log data or not and outputs the detection result to each of the operator terminal units (result outputting portion) 2A through 2C and the engineer PC (result outputting portion) 6.

The engineer PC 6, a computer that is used by an engineer, receives a detection result due to the abnormality detection server 5 and can display.

Figure 2:
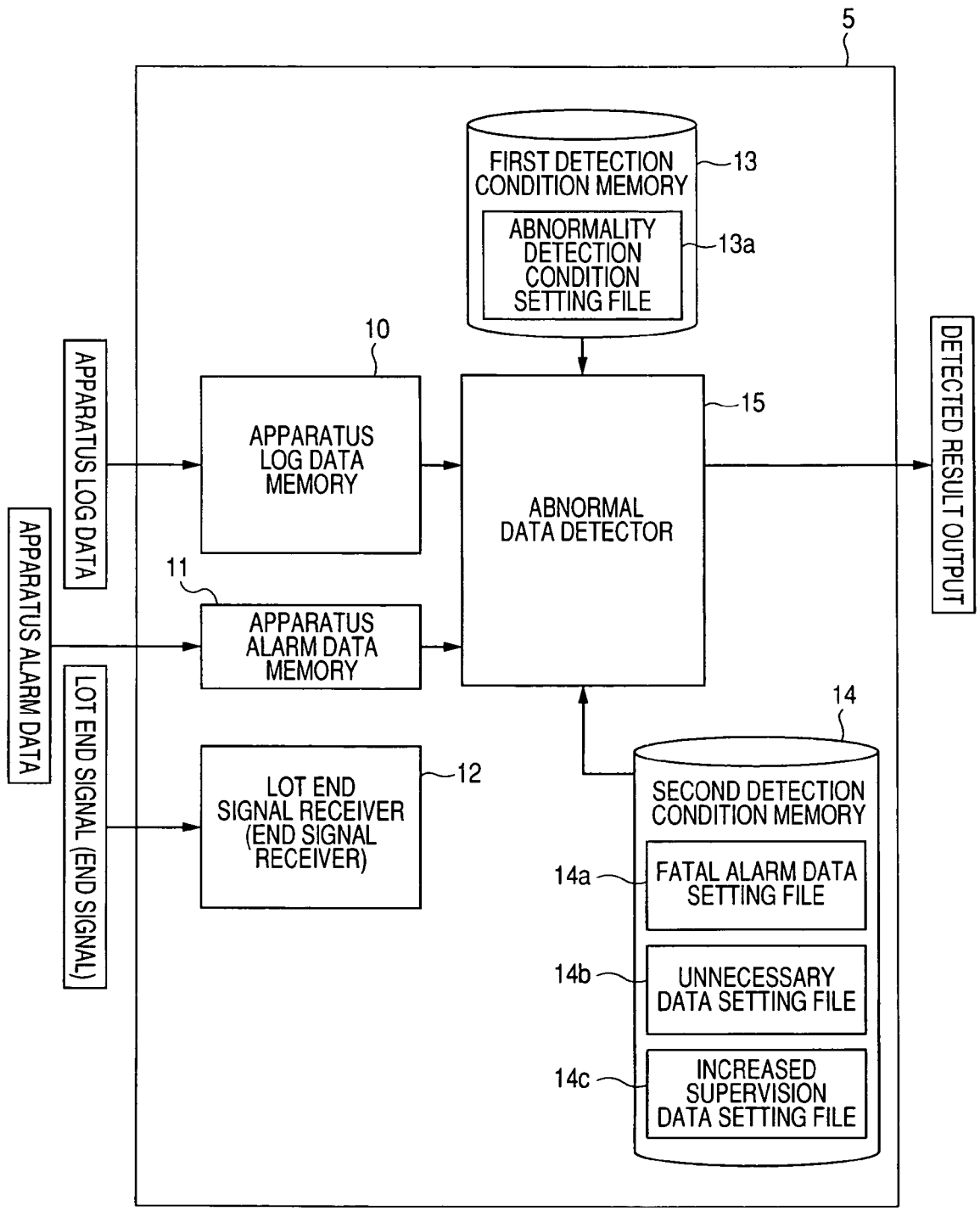
FIG. 2 is a diagram showing an internal configuration of an abnormality detection server.

In the next place, an internal configuration of the abnormality detection server 5 will be described. As shown in FIG. 2, the abnormality detection server 5 includes an apparatus log data memory 10, an apparatus alarm data memory 11, a lot end signal receiver 12, a first detection condition memory 13, a second detection condition memory 14 and a abnormal data detector 15.

The apparatus log data memory 10 stores the apparatus log data inputted from the apparatus data management server 4 and is constituted of, for instance, a cache memory. In the apparatus log data memory 10, for instance, the apparatus log data outputted every time when the processing of a wafer came to completion in the semiconductor manufacturing apparatuses 1A through 1C are stored.

The apparatus alarm data memory 11 stores the apparatus alarm data inputted from the apparatus data management server 4 and is constituted of, for instance, a cache memory.

The lot end signal receiver (end signal receiver) 12 is constituted so as to receive a lot end signal transmitted from the semiconductor manufacturing apparatuses 1A through 1C. When the lot end signal receiver 12 receives a lot end signal, the abnormality detection server 5 detects whether there are abnormal data in the apparatus log data stored in the apparatus log data memory 10 or not.

The first detection condition memory 13 stores conditions for carrying out the abnormality detection of the apparatus log data and is constituted of, for instance, a hard disc. In the first detection condition memory 13, for instance, an abnormality detection condition setting file 13a is stored.

The second detection condition memory 14 stores a file for carrying out the abnormality detection based on the apparatus alarm data and is constituted of, for instance, a hard disc. As a file that is stored in the second detection condition memory 14, a fatal alarm data setting file 14a, an unnecessary data setting file 14b and an increased supervision data setting file 14c can be cited.

The abnormal data detector 15 is constituted so as to detect whether there are abnormal data in the apparatus log data stored in the apparatus log data memory 10 or not. That is, when a lot end signal is received at the lot end signal receiver 12, the abnormal data detector 15 references a content of the abnormality detection condition setting file 13a stored in the first detection condition memory 13 to acquire a condition for the abnormality detection, and, based on the acquired condition, carries out the abnormality detection of the apparatus log data stored in the apparatus log data memory 10.

Furthermore, the abnormal data detector 15, when the apparatus alarm data are stored in the apparatus alarm data memory 11, inputs the apparatus alarm data stored in the apparatus alarm data memory 11 to judge whether the inputted apparatus alarm data correspond to a content of the fatal alarm data setting file 14a, the unnecessary data setting file 14b or the increased supervision data setting file 14c stored in the second detection condition memory 14 or not, and thereby the abnormality detection can be carried out.

Figure 3:
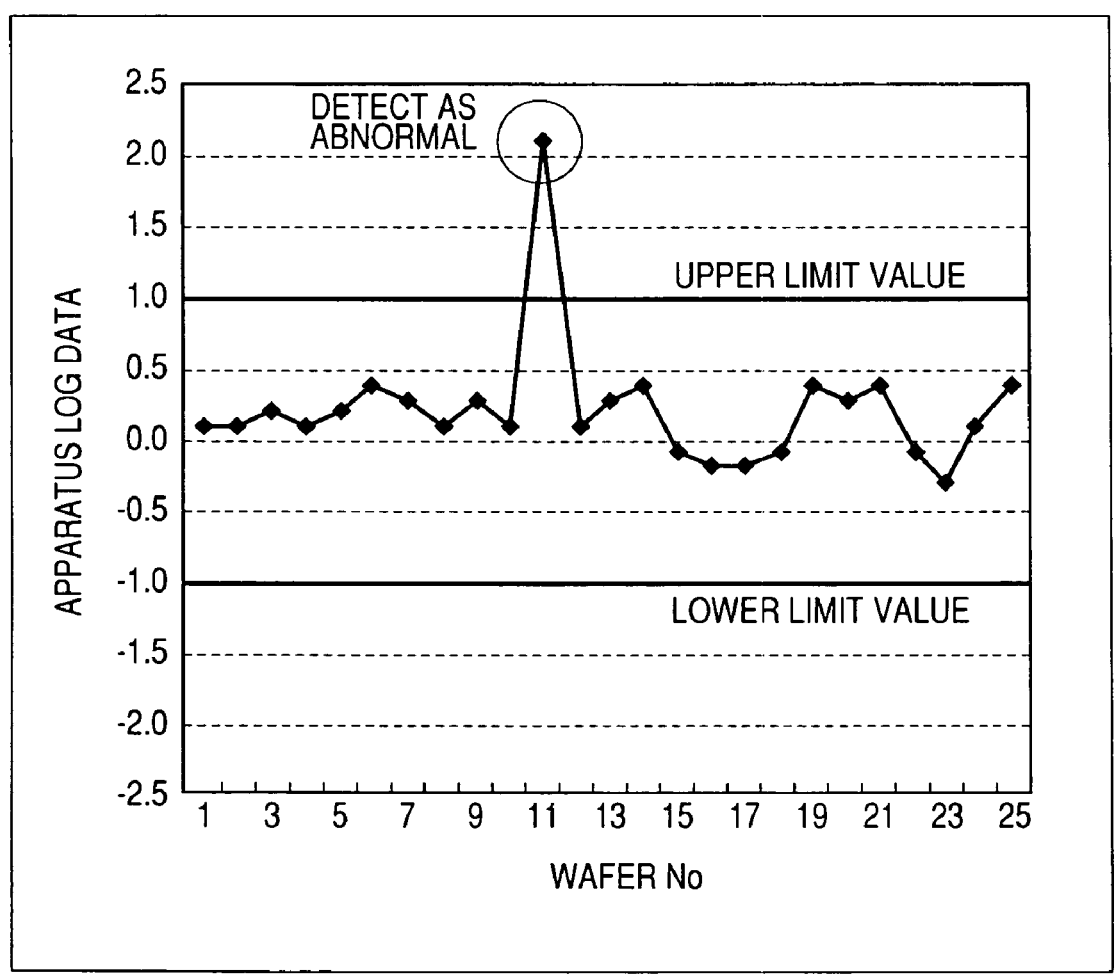
FIG. 3 is a diagram explaining logic for detecting a sudden abnormality.

In the next place, with several examples, a logic (architecture) with which the abnormal data detector 15 detects an abnormality of the apparatus log data will be described. FIG. 3 is a diagram explaining a logic for detecting a sudden abnormality that occurs suddenly. A horizontal axis expresses a wafer No and a vertical axis shows a value of data of the apparatus log data. As obvious from FIG. 3, a value of the apparatus log data corresponding to the wafer No. "11" is substantially "2.2" and very higher than the apparatus log data corresponding to other wafer Nos. This means that a sudden abnormality occurs at the semiconductor manufacturing apparatus that processes a wafer with the wafer No "11" and the wafer with the wafer No "11" is highly likely to be a fault. Accordingly, when such prominent apparatus log data like this occur, it is necessary to detect as an abnormality. In order to detect the apparatus log data salient from other apparatus log data as abnormal, it can be achieved in such a manner that, as shown in FIG. 3, with upper and lower limit values set in the apparatus log data, while when a value of the apparatus log data is present between the set upper and lower limit values, it is judged normal, and, when a value of the apparatus log data is outside of a range between the set upper and lower limit values, it is judged abnormal.

As a method of setting the upper and lower limit values, there is a method due to σ criterion, in which an average value and a standard deviation are calculated from past data to which the abnormality detection was applied in the past and the calculated average value and standard deviation are used. That is, as shown in FIG. 1, in the past data memory 4a in the apparatus data management server 4, the apparatus log data detected of whether there is an abnormality or not are stored. Accordingly, the abnormal data detector 15 makes an access to the past data memory 4a to extract targeted past data and from the extracted past data an average value and a standard deviation are calculated. Therewith, based on the calculated average value and standard deviation, present apparatus log data can be judged.

Here, the past data used to calculate an average value and a standard deviation are preferable to be ones that are judged as normal. However, the past data stored in the past data memory 4a contain not only ones judged as normal but also ones judged as abnormal. Accordingly, when the past data are simply extracted, there is a risk of extracting not only the past data judged normal but also the past data judged as abnormal. In this connection, it can be arranged so that, with the upper and lower limit values set to the past data, the past data deviated from the set upper and lower limit values may not be used to calculate an average value and a standard deviation. Furthermore, by use of a screening method, the past data judged abnormal can be eliminated. Still furthermore, an EWMA (Exponential Weighted Moving Average) method where, after past data of not only of past one lot but also of past several lots are extracted and a standard deviation is calculated for each of lots, the respective calculated standard deviations are weighted to calculate an ideal standard deviation can be used.

Furthermore, in the above, a σ criterion method where an average value and a standard deviation calculated from the past data are used as a lower limit value and an upper limit value to detect an abnormality of the apparatus log data was described. However, without restricting thereto, an upper and lower limit judgment method where for instance an engineer sets upper and lower limit values may be used, and a width judgment method where a width is set not from upper and lower limit values but from an average value may be used.

In the σ criterion method that uses the past data, when values of the apparatus log data at the normal time hardly exhibit variation, a calculated standard deviation is very small. Accordingly, even a small variation that is within a normal range is detected as abnormal. In this case, not with the σ criterion method but with the width judgment method that assigns a constant width that generates a normal value, misinformation can be suppressed from occurring.

Figure 4:
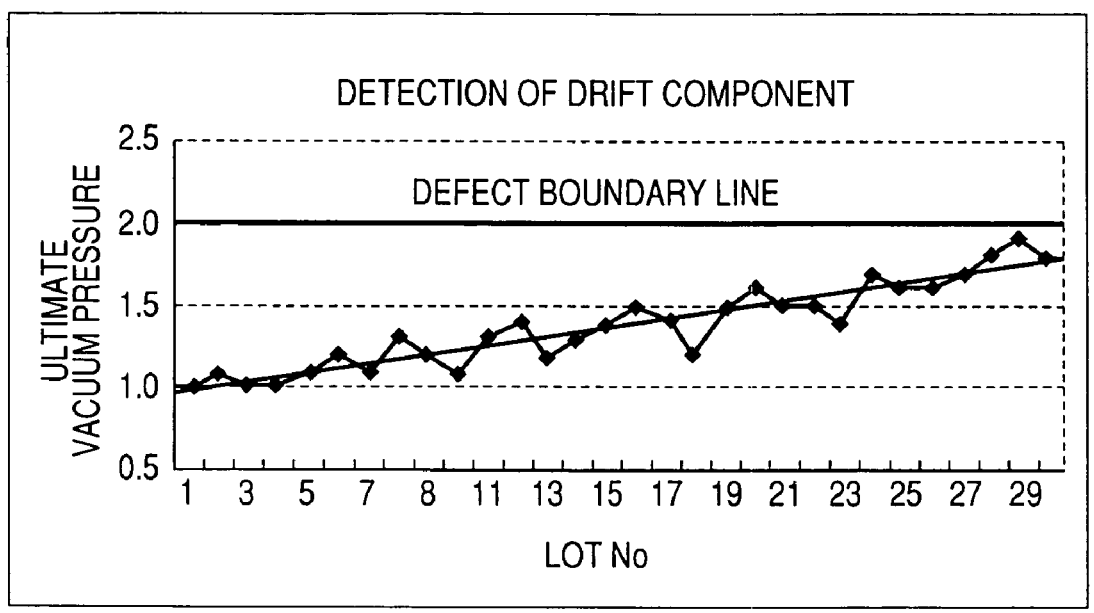
FIG. 4 is a diagram explaining logic for detecting a drift abnormality.

Next, FIG. 4 is a diagram explaining a logic for detecting a drift abnormality. A horizontal axis expresses a lot No and a vertical axis shows ultimate vacuum that is one of the apparatus log data. As obvious from FIG. 4, it is found that, with an increase in the lot No, the ultimate vacuum drifts to be deteriorated. In this case, when the wafers are further processed and thereby the lot No is further increased, the ultimate vacuum exceeds a faulty boundary line that generates a faulty product to result in producing a large volume of faulty products. In this connection, as a method of detecting the drift abnormality, when a case where an increment (gradient of linear line in FIG. 4) of the ultimate vacuum relative to an increment of the lot No exceeds a predetermined value is judged abnormal, faulty products can be inhibited in advance from being produced in a large volume.

In FIG. 4, not a case where the apparatus log data are outputted on a wafer unit from the semiconductor manufacturing apparatuses 1A through 1C but a case where the apparatus log data are outputted on a lot unit was described. That is, in the embodiment 1, a case where the apparatus log data are outputted on a wafer unit from the semiconductor manufacturing apparatuses 1A through 1C and based on the lot end signal the abnormality detection is started is described. However, the invention, without restricting thereto, can be applied as well to a case where, as shown in FIG. 4, the apparatus log data are outputted on a lot unit and, based on a batch end signal outputted when one batch is completely processed, an abnormality detection is applied.

Figure 5:
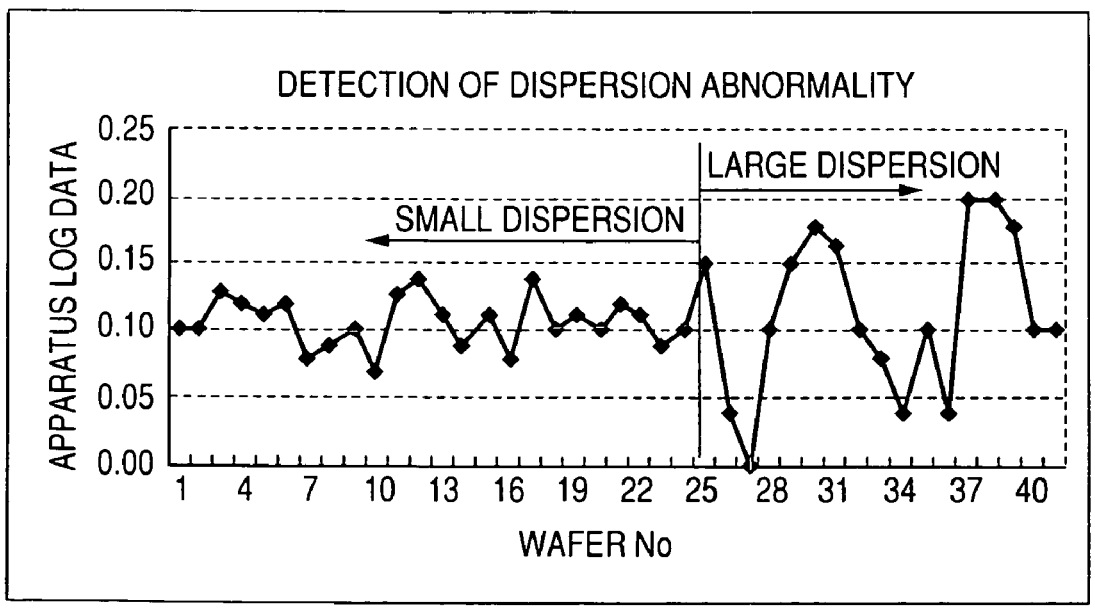
FIG. 5 is a diagram explaining logic for detecting a dispersion abnormality.

In the next place, FIG. 5 is a diagram that explains a logic with which the dispersion abnormality is detected. A horizontal axis expresses a wafer lot No and a vertical axis shows apparatus log data. As obvious from FIG. 5, in comparison with the dispersion of the apparatus log data between wafers in a first lot (wafer No 1 through 25), the dispersion of the apparatus log data between wafers in a second lot (wafer No 26 and after that) is larger. When the dispersion of the apparatus log data increases, a risk of manufacturing faulty wafers becomes larger. In this connection, as a method of detecting such dispersion abnormality, such a method as that a standard deviation of the apparatus log data is calculated for each of lots, a case where a standard deviation in a lot that is a target of the present abnormality detection is abnormally higher than a standard deviation in a lot earlier for instance by one lot is judged abnormal, and thereby the dispersion abnormality is detected can be taken.

Figure 6:
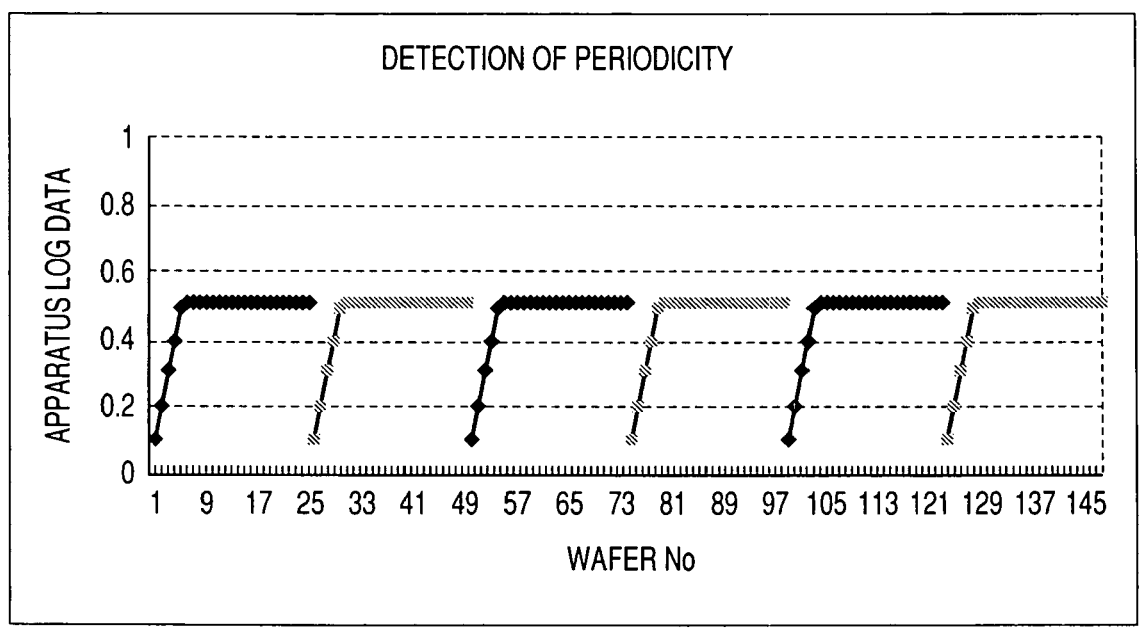
FIG. 6 is a diagram explaining logic for detecting an abnormality with periodic apparatus log data.

In the next place, FIG. 6 is a diagram explaining a logic of detecting an abnormality by use of periodic apparatus log data. A horizontal axis shows a wafer No and a vertical axis shows apparatus log data. As the apparatus log data in a vertical axis, data corresponding to, for instance, a focal point (best focusing) in an exposure unit can be cited. In the exposure unit, when one lot of wafers is processed, a lens for projecting a recite on a wafer is cold in the beginning, however, as the lens is continued to use, a temperature goes up to be a certain constant temperature. When a temperature goes up, a lens expands and the refractive index varies to result in varying a focal point. Accordingly, as shown in FIG. 6, in first several wafers in one lot, as the temperature goes up, the apparatus log data vary, and, after that, since the wafer temperature becomes constant, the apparatus log data become a constant value. Such a trend appears periodically every time when the lot is replaced. When a focal point after the temperature is stabilized is used, there is a risk in that wafers processed in an early part of one lot are exposed in a little off-focused state to result in faulty products. In this connection, when the apparatus log data are rendered periodic data and a threshold value is disposed, a periodically appearing abnormality can be detected.

As mentioned above, with several examples, logics of detecting an abnormality of the apparatus log data with an abnormal data detector 15 are explained. An abnormality detection logic carried out in the abnormality detector 15 can be set in the abnormality detection condition setting file 13a shown in FIG. 2. Furthermore, in the logic for detecting a sudden abnormality, as mentioned above, which method of the σ-criterion method, the upper and lower limit value method or the width judgment method is used to detect a sudden abnormality can be set.

In the next place, contents of the abnormality detection condition setting file 13a, the fatal alarm data setting file 14a, the unnecessary data setting file 14b and the increased supervision data setting file 14c will be described.

FIG. 7 shows a relationship between the abnormality detection condition setting file 13a, the fatal alarm data setting file 14a, the unnecessary data setting file 14b and the increased supervision data setting file 14c and a file present in an underlayer thereof.

In FIG. 7, files that are used in the abnormality detection that uses the apparatus log data are the abnormality detection condition setting file 13a, a calculating formula definition file 15a, an abnormal value elimination definition file 16, an apparatus log data detection ON/OFF setting file 17, an error message definition file 18, a mail address setting file 19, an attached file 20 and an apparatus group assignment file 21.

The abnormality detection condition setting file 13a is a fundamental file for setting a condition for detecting an abnormality of the apparatus log data and has a structure shown in FIG. 8. In FIG. 8, though shown over two stages for convenience sake of page space, in actuality, abnormality detection condition setting file 13a has a data structure of a continuous one row.

The abnormality detection condition setting file 13a has, roughly speaking, items such as a search key, an apparatus log data setting portion, common, σ abnormality judgment, upper and lower limit value judgment and width abnormality judgment. For instance, when a set content assigned to the condition No 1 of the abnormality detection condition setting file 13a is checked, as a setting key present below an apparatus name in the search key, [A] is assigned, and as an apparatus name, a product name and a process name, [key] is assigned. In the operator terminal display ON/OFF, [ON] is assigned, and a mail distribution address is assigned to [all member]. Furthermore, in an apparatus log data apparatus side name, [G1] is assigned. Still furthermore, when explained about lower stage displays, to a judgment method, an error message and an attached file, respectively, [inside lot], [1] and [101] are assigned. Furthermore, in the σ abnormality judgment, to a judgment ON/OFF and a σ coefficient, respectively, [ON] and [3] are set.

The content of the condition number 1 of the abnormality detection condition setting file 13a like this is as follows. That is, since [G1] is described in the apparatus log data apparatus side name, the apparatus log data that are a target of which abnormality is detected is [G1] and since the judgment method is described as [within lot], after a lot end signal is received, the apparatus log data for one lot of wafers (25 pieces) are judged of the abnormality. A judgment method at this time is, since a judgment ON/OFF of the σ abnormality judgment is turned [ON], the σ abnormality judgment, and a width of a permissible value at this time is, since the σ coefficient is assigned to [3], set at [3σ]. The judgment method may be assigned to not [within lot] but [continuous]. In this case, every time when the apparatus log data are input in the abnormality detection server 5, the apparatus log data are judged of the abnormality. That is, the abnormality detection server 5 can judge, each time when the apparatus log data are stored in the apparatus log data memory 10, as well whether an abnormality is present in the apparatus log data.

As to an output address of a detection result when an abnormality is detected, since the operator terminal display ON/OFF is turned [ON] and the mailing address is assigned to [all members], a detection result is outputted to the operator terminal units 2A through 2C and engineer PCs 6 of all engineers registered in the mail address setting file. Furthermore, when an abnormality is detected, since the error message is set to [1] and the attached file is set to [101], a content described [1] of the error message definition file is outputted and the attached file [101] is attached.

In the next place, in the abnormality detection condition setting file 13a, a setting key present below an apparatus name within the search key will be described. In the condition No 1, [A] is set in the setting key. The setting key shows one obtained by applying grouping to the semiconductor manufacturing apparatuses. Normally, when the condition No 1 is set, the semiconductor manufacturing apparatus corresponding to the condition No 1 is limited to one. However, when the same condition is set to a plurality of semiconductor manufacturing apparatuses, since the same condition has to be set for each of the semiconductor manufacturing apparatuses, the setting operation becomes troublesome. In this connection, as shown in FIG. 8, with an item of setting key disposed in the abnormality detection condition setting file 13a, it is enabled to set to a plurality of the semiconductor manufacturing apparatuses under one condition No 1. When the grouping is enabled to set like this, a condition setting operation of an operator can be alleviated.

As a file for setting groups of the semiconductor manufacturing apparatuses, there is an apparatus group assignment file 21. An example of a content of the apparatus group assignment file 21 is shown in FIG. 9. In FIG. 9, for instance, in a group of which apparatus grouping name is [A], semiconductor manufacturing apparatuses having names of [F-01] through [E-04] are contained. The grouping of the semiconductor manufacturing apparatuses can be arbitrarily set.

Next, an apparatus log data detection ON/OFF setting file 17 will be described. The grouping of the semiconductor manufacturing apparatuses can be carried out according to the apparatus group assignment file 21. Here, it is assumed that, for instance, both of conditions No 1 and No 2 shown in FIG. 8 are set to the same group (setting key is set to [A] in FIG. 8). For instance, when [A] is assigned to the setting keys of the conditions No 1 and No 2 of the abnormality detection condition setting file 13a, all semiconductor manufacturing apparatuses belonging to a group corresponding to the [A] are subjected to the abnormality detection of the apparatus log data shown with the condition No 1 and the apparatus log data shown with the condition No 2. However, in this case, depending on the semiconductor manufacturing apparatuses contained in the group, there is a case where the apparatus log data shown with the condition No 1 are subjected to the abnormality detection but the apparatus log data shown with the condition No 2 aren't necessarily subjected to the abnormality detection.

In this connection, in the semiconductor manufacturing apparatuses belonging to the same group, whether the abnormality detection of the apparatus log data is separately carried out or not is enabled to set. A file carrying out such a setting is an apparatus log data detection ON/OFF setting file 17.

In FIG. 10, an example of a content of the apparatus log data detection ON/OFF setting file 17 is shown. In FIG. 10, eight semiconductor manufacturing apparatuses of which apparatus names are [F-01] through [E-03] belong to one group. Here, when the [G1] that is the apparatus log data is checked, since the semiconductor manufacturing apparatuses of which apparatus names are [F-01] through [F-05] are assigned to [ON], these are set to be subjected to the abnormality detection. On the other hand, the semiconductor manufacturing apparatuses of which apparatus names are [E-01] through [E-03] are assigned to [OFF]. Accordingly, it is found that even in the semiconductor manufacturing apparatuses belonging to the same group, whether the abnormality detection of the apparatus log data is separately applied or not can be set.

In the next place, a function of a search key of the abnormality detection condition setting file 13a shown in FIG. 8 will be described. As a method of judging the abnormality of the apparatus log data, there is a method where an engineer sets upper and lower limit values and when a value of the apparatus log data is deviated from a range of the set upper and lower limit values the abnormality is detected. At this time, the engineer has to set upper and lower limit values in advance, the number thereof is huge. That is, even when the apparatus log data themselves are same, depending on products, processes and kinds of the semiconductor manufacturing apparatuses, the apparatus log data that are normal are different. Accordingly, even one kind of the apparatus log data, for every different products, processes and kinds of the apparatuses, the upper and lower limit values have to be set. This is a very troublesome process. FIG. 11 shows an example of setting the upper and lower limit values. In FIG. 11, as the apparatus log data, [Global Alignment Measurement Shift X] is taken, and a case where the upper and lower limit values of the [Global Alignment Measurement Shift X] are set is considered. As shown in FIG. 11, when it is assumed that there are product [α], steps [1] through [4] and apparatuses [#1] and [#2], eight kinds of the upper and lower limit values have to be set to one kind of the apparatus log data. In actuality, the number is far larger than the foregoing case. For instance, when to one kind of the apparatus log data there are 20 kinds of products, 30 kinds of processes and 60 kinds of apparatuses, the number of kinds of the upper and lower limit values that have to be set amounts to 20×30×60=36000 kinds, resulting in a very troublesome situation.

In this connection, in order to alleviate the burden on the engineer, a function that uses past data stored in the past data memory 4a of the apparatus data management server 4 shown in FIG. 1 to automatically calculate upper and lower limit values was developed. In the beginning, the engineer can assign a header of the apparatus log data as a search key of the abnormality detection condition setting file 13a. In the abnormality detection condition setting file 13a shown in, for instance, FIG. 8, a search key can be assigned from a recipe No, an apparatus name, a chamber, a step ID, a product name and a process name that are headers of the apparatus log data. Here, in the condition No 1 for instance, three headers of the apparatus name, product name and process name are assigned as search keys. In FIG. 12, for simplicity sake, items of search keys set as the condition No 1 from the abnormality detection condition setting file 13a, the kind of the apparatus log data and σ coefficient alone are described.

As a next step, the abnormality detection of the apparatus log data (global alignment measurement shift X) stored in the apparatus log data memory 10 is carried out. In the beginning, the abnormality detector 15 shown in FIG. 2, while referencing the abnormality detection condition setting file 13a, acquires a search key that assigns a header. In the present case, as shown in FIG. 12, among headers, a product name, a process name and an apparatus name are search keys. Subsequently, the abnormal data detector 15 acquires, from the apparatus log data stored in the apparatus log data memory 10, specific contents of the product name, process name and apparatus name assigned as a search key. In FIG. 13, a content of a header of the apparatus log data stored in the apparatus log data memory 10 is shown. When, from a content shown in, for instance, FIG. 13, the product name, process name and apparatus name assigned as a search key are acquired, acquired contents become product name [α], process name [3] and apparatus name [#1].

As a next step, the abnormal data detector 15 extracts past data having a header of a content coinciding with a content of an acquired header from the past data memory 4a. An average value and a standard deviation are calculated from the extracted past data and therefrom upper and lower limit values are automatically calculated. Thus, when an engineer specifies search keys alone, necessary upper and lower limit values can be automatically calculated. Accordingly, an operational burden on the engineer can be alleviated.

In the next place, the calculating formula definition file 15a will be described. There is a case where as the apparatus log data for detecting the abnormality not the apparatus log data outputted from the apparatus but the apparatus log data obtained by applying an operation to the outputted apparatus log data have meaning. In the case, a file for obtaining the apparatus log data obtained by applying an operation is the calculating formula definition file 15a. In FIG. 14, an example showing a content of the calculating formula definition file 15a is shown. In FIG. 14, it is found that, for instance, the apparatus log data of which detection item content is [parameter Z] is calculated with a calculating formula (Ch1+Ch4)/2−(Ch2+Ch5)/2 by use of values [Ch1], [Ch2], [Ch4] and [Ch5] of calculating parameters P1 through P4.

Then, the error message definition file 18 is one that defines an error message when an abnormality is detected and has a content such as shown in FIG. 15. When an error No described in the error message definition file 18 is assigned to an item of the error message of the abnormality detection condition setting file 13a shown in FIG. 8, an error message of the assigned error No can be displayed.

The attached file 20 is a file that is attached to an output of a detection result and, when the abnormality is detected, can instruct a detailed operation. Specifically, an example of a content of the attached file 20 is shown in FIG. 16. In FIG. 16, an attached file when the abnormality detection was carried out by use of the global alignment measurement data as the apparatus log data is shown. An operator, when receiving the attached file, inputs a lot No, a wafer No, specifications in X and Y directions and measurement results. Thereupon, a judgment result is automatically outputted and thereby whether the abnormality actually occurred or not can be confirmed.

The abnormal value elimination definition file 16 is a file that is used to eliminate data that are in advance known as abnormal from the apparatus log data. The apparatus log data here eliminated do not show the abnormality of the semiconductor manufacturing apparatus but show obviously abnormal data generated by apparatus bag or a problem of apparatus communication.

The mail address setting file 19 is a file that assigns, when the abnormality is detected, an outputting address of a detection result and where mail addresses are written.

In the next place, a file that is used in the abnormality detection that uses the apparatus alarm data will be described. In FIG. 7, the files that are used in the abnormality detection that uses the apparatus alarm data are a fatal alarm data setting file 14a, an unnecessary data setting file 14b, an increased supervision data setting file 14c, an error message definition file 18, a mail address setting file 19, an attached file 20 and an apparatus group assignment file 21.

Since the error message definition file 18, mail address. setting file 19, attached file 20 and apparatus group assignment file 21 were described as the files that are used in the abnormality detection that uses the apparatus log data, descriptions thereof will be omitted here.

The fatal alarm data setting file 14a is a file in which the apparatus alarm data that are fatal when a wafer is processed are registered and a content thereof is as shown in, for instance, FIG. 17. As shown in FIG. 17, the apparatus alarm data, when corresponding to fatal alarm data [A0001], [A0002], [A0003] and [B0***], correspond to a fatal error. Furthermore, in the fatal alarm data setting file 14a, there are items of terminal display ON/OFF and mailing address, and, when a fatal error is caused, the error message is shown in operator terminal units 2A through 2C and an engineer PC6.

The unnecessary data setting file 14b is a file where data that are unnecessary to be assumed as abnormal when a wafer is processed of the apparatus alarm data are registered and a content thereof is as shown in, for instance, FIG. 18. As shown in FIG. 18, when the apparatus alarm date correspond to unnecessary data [X0001], [X0002] and

[Y00**], without applying the abnormality detection, the abnormality detection process is finished.

The increased supervision data setting file 14c is a file where data that are judged as abnormal when the apparatus alarm data occur at the number of times equal to or more than predetermined number of times during a predetermined time period are registered and, as shown in FIG. 19, a time period and the number of times can be set. As shown in FIG. 19, when for instance the apparatus alarm data correspond to the increased supervision data [Z0001], when the apparatus alarm data occur 10 times or more within 2 hr, an error message is displayed.

The number of the apparatus alarm data is very large. When a stepper that is an exposure unit is taken as an example, the number amounts to several tens of thousands. Accordingly, it is difficult to set whether the apparatus alarm data are fatal or not. In this connection, in order to effectively detect the abnormality, while fatal alarm codes are registered within a range that is known, the apparatus alarm data that are eliminated from the abnormality detection judgment are registered as unnecessary data. Furthermore, to codes that are not registered, as shown in FIG. 19, default setting is applied in the increased supervision data setting file 14c, and with default set content the abnormality is detected.

In the next place, a function of outputting a detection result when the abnormality is detected with the apparatus log data will be described.

When the abnormality is detected, unless a method of checking apparatus, a QC (Quality Control) method and how to handle products can be clearly instructed, even when an abnormality is detected, the lot flows and a faulty wafer cannot be inhibited in advance from being produced. In this connection, in the embodiment, a function for outputting a result of detection when an abnormality is detected will be described.

In FIG. 20, an output content of a result of detection when the abnormality is detected with the apparatus log data is shown. As shown in FIG. 20, in order to notify an operator of occurrence of the abnormality when the abnormality is detected, contents described in the headers of the apparatus log data such as a starting time of the operation, a product name, a process name, a recipe name and an apparatus name are outputted to operator terminal units 2A through 2C. Furthermore, whether there is an apparatus error or not and a content of the error message are displayed. When whether there is an apparatus error or not and detailed information of a target product are necessary, when the respective items are clicked, the respective detailed screens can be obtained.

When, for instance, [yes] of the apparatus error is clicked, a screen having a content such as shown in FIG. 21 can be displayed. That is, an occurrence time period of the apparatus error, wafer No and a content are displayed. In a first row of FIG. 21, specifically, an occurrence time of the apparatus error of [15:30], the wafer No of [10] and the content of [vacuum pressure abnormality] are displayed.

Furthermore, when [open] described in a column of a target product of the error message shown in FIG. 20 is clicked, a screen having a content such as shown in FIG. 22 is displayed. That is, a lot No, a wafer No, a detection item (apparatus log data) and a detection method are displayed. Specifically, for instance, a lot No of [A0001], a wafer No of [1], a detection item of [vacuum pressure] and a detection method of [upper and lower limit values] are displayed.

Furthermore, when [yes] of a check file of the error message shown in FIG. 20 is clicked, an attached file such as shown in FIG. 23 is displayed. The attached file is one with which a handling method when the abnormality is detected can be instructed in detail. In the attached file, when an operator checks a measurement value and a checked result is inputted in a column of a measurement value, OK or NG can be automatically displayed.

Still furthermore, handling of an operator when the abnormality is detected is very important when the abnormality occurs; accordingly, the foregoing attached file can be stored in the abnormality detection server 5.

The contents shown in FIGS. 20 through 23 can be distributed by mail to an address registered to notify an engineer of the occurrence of the abnormality.

In the next place, a function that outputs a result of detection when the abnormality is detected with the apparatus alarm data will be described.

In FIG. 24, contents that are outputted when the abnormality is detected with the apparatus alarm data are shown. As shown in FIG. 24, an occurrence time period, an error kind, apparatus alarm data, a lot No, a wafer No, contents of alarm and an engineer's instruction are displayed on operator terminal units 2A through 2C. Subsequently, when a check box is checked and a return bottom is pushed, contents shown in FIG. 25 are displayed. In FIG. 25, since an input column of line comment where how an operator handled the error can be described is disposed, the operator can describe how the operator handled the error in the column. Then, when the operator checks transmission shown in FIG. 25 and pushes input completion, the data having the contents shown in FIG. 25 are distributed to the engineer and at the same time stored in the abnormality detection server 5.

The embodiment 1 is constituted as mentioned above and an example of an operation and advantages thereof will be described below with reference to the drawings.

Firstly, an operation that detects an abnormality with the apparatus log data will be described. As shown in FIG. 26, according to an instruction of, for instance, an operator terminal unit 2A, in semiconductor manufacturing apparatus 1A, a wafer is started to process (S101). Subsequently, when the processing of the wafer comes to completion in the semiconductor manufacturing apparatus 1A, apparatus log data are transmitted from the semiconductor manufacturing apparatus 1A to an operator terminal unit 2A (S102).

Then, the operator terminal unit 2A transmits received apparatus log data to a data handling server 3A (S103). The data handling server 3A transmits received apparatus log data to an apparatus data management server 4 (S104).

The apparatus data management server 4 transmits received apparatus log data to an abnormality detection server 5 (S105). Subsequently, the abnormality detection server 5 stores the apparatus log data in an apparatus log data memory 10 in the abnormality detection server 5 (S106).

Subsequently, when the processing of wafers of one lot does not come to completion in the semiconductor manufacturing apparatus 1A, S102 through S106 are repeated (S107). When the processing of wafers of one lot comes to completion, a lot end signal is transmitted from the semiconductor manufacturing apparatus 1A (S108). Then, the error detection server 5 receives a lot end signal at a lot end signal receiver 12 in the abnormality detection server 5 (S109).

Figure 27:
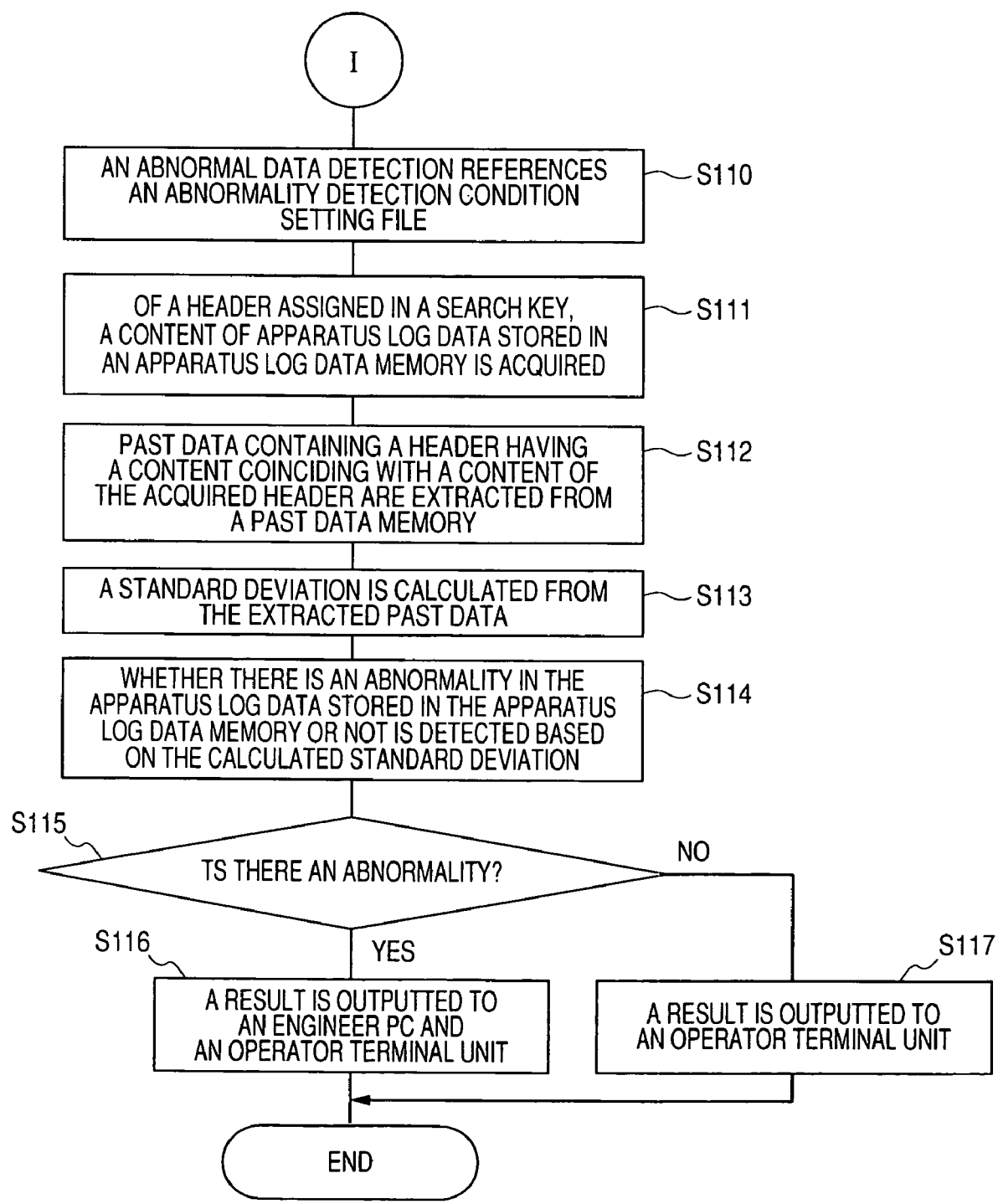
FIG. 27 is a flow chart explaining an operation of detecting an abnormality by use of the apparatus log data.

Next, as shown in FIG. 27, when the lot end signal is received at the lot end signal receiver 12, an abnormal data detector 15 acquires a search key that assigned a header with reference to an abnormality detection condition setting file 13a stored in a first detection-condition memory 13 (S110). Subsequently, of the header assigned by the acquired search key, a content of the apparatus log data stored in the apparatus log data memory 10 is acquired (S111).

Subsequently, past data containing a header having a content coinciding with a content of the acquired header are extracted from a past data memory 4a (S112). Then, the abnormal data detector 15 calculates, based on the extracted past data, an average value and a standard deviation (S113). Thereafter, the abnormal data detector 15, based on calculated average value and standard deviation, detects whether there is an abnormality in the apparatus log data stored in the apparatus log data memory 10 (S114).

In the next place, when an abnormality is detected at the abnormal data detector 15 (S115), detection results are transmitted to an engineer's PC6 and the operator terminal unit 2A (S116). On the other hand, when an abnormality is not detected at the abnormal data detector 15 (S115), results are transmitted to the operator terminal unit 2A alone (S117). Thus, the abnormality of the apparatus log data can be detected.

Since whether an abnormality is present in the apparatus log data or not is judged every time when wafers of one lot are processed in the semiconductor manufacturing apparatus, a manufacturing method of a semiconductor integrated circuit device, which can detect an off-specification faulty wafer in real time can be provided. Accordingly, a wafer can be inhibited in advance from becoming a complete faulty product.

Furthermore, since the abnormality of the apparatus log data can be detected in real time, the abnormality of the semiconductor manufacturing apparatus and process that become a reason of mass production of faulty wafers can be discovered early.

Since, by use of the mailing function, detection results can be distributed to the engineer's computer, the engineer can be rapidly notified of the abnormality.

The apparatus log data, being data showing a state of the apparatus, can detect not only faulty wafers generated owing to the malfunction of the apparatus itself but also faulty wafers when the process malfunction is reflected on the apparatus log data.

Furthermore, since the apparatus log data are outputted from the semiconductor manufacturing apparatus every time when a wafer is processed, the wafer and the apparatus log data are in one-to-one correspondence. Accordingly, even of wafers that are not checked in the sampling inspection, an abnormality can be detected.

In the next place, an operation of detecting an abnormality by use of the apparatus alarm data will be described. In the beginning, the apparatus alarm data are transmitted from the semiconductor manufacturing apparatus 1A. The apparatus alarm data, as mentioned above, are inputted through the operator terminal unit 2A, the data handling server 3A and the apparatus data management server 4 finally in the abnormal data detector 5.

Figure 28:
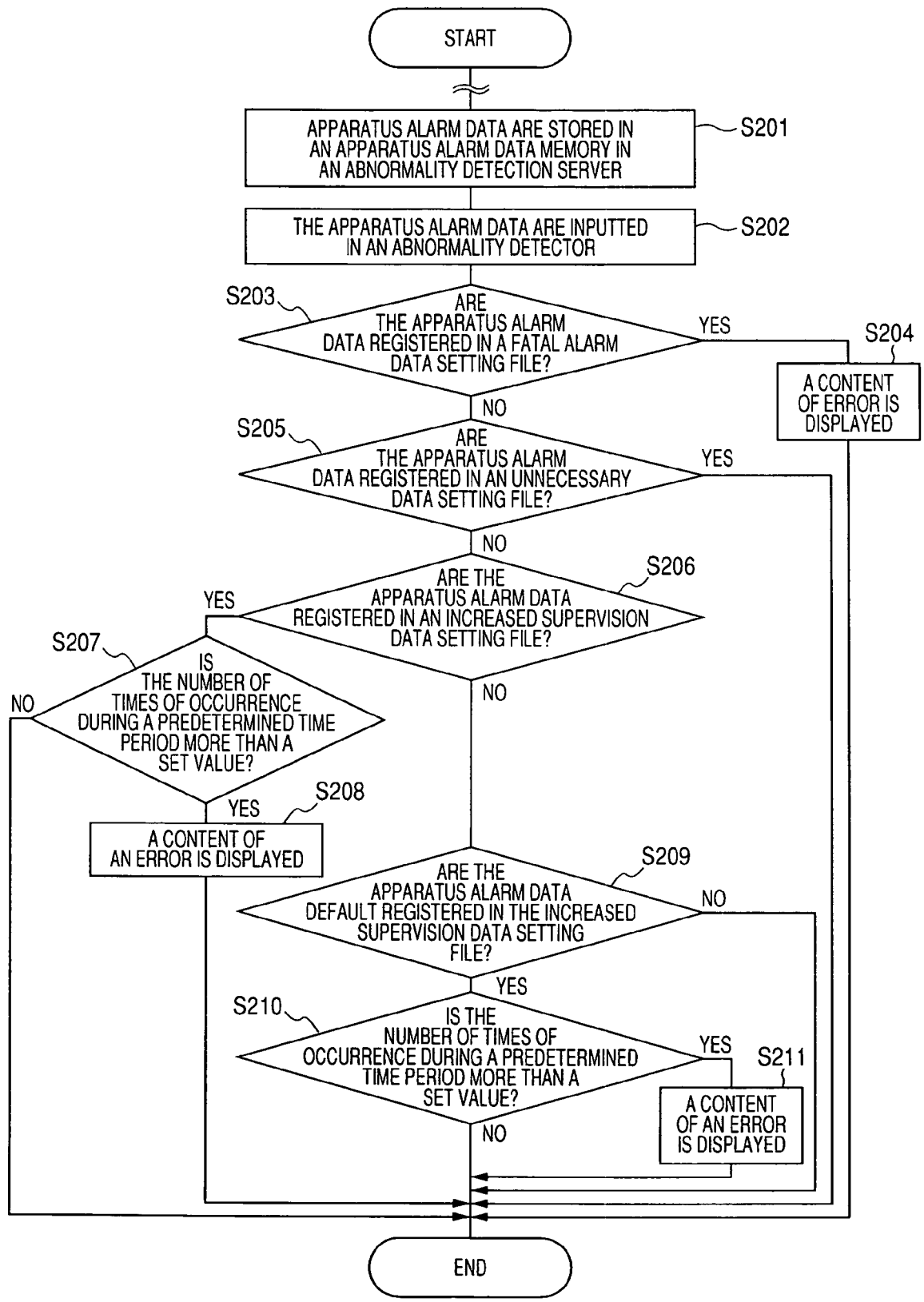
FIG. 28 is a flow chart explaining an operation of detecting an abnormality by use of the apparatus alarm data.

Subsequently, as shown in FIG. 28, the apparatus alarm data are stored in an apparatus alarm data memory 11 in the abnormality detection server 5 (S201). Then, the apparatus alarm data stored in the apparatus alarm data memory 11 are inputted in the abnormal data detector 15 (S202). The abnormal data detector 15 judges whether the apparatus alarm data coincide with the fatal alarm data set in the fatal alarm data setting file 14a stored in a second detection condition memory 14 or not (S203).

When the apparatus alarm data coincide with the fatal alarm data, an error display is carried out to the operator terminal unit 2A and the engineer's PC6 (S204) When the apparatus alarm data do not coincide with the fatal alarm data, whether the apparatus alarm data coincide with the unnecessary data set in the unnecessary data setting file 14b or not is further judged (S205). When the apparatus alarm data coincide with the unnecessary data, without applying the abnormality detection, the process is brought to completion. On the other hand, when the apparatus alarm data do not coincide with the unnecessary data, subsequently, whether the apparatus alarm data coincide with the increased supervision data set in the increased supervision data setting file 14c or not is further judged (S206).

When the apparatus alarm data coincide with the increased supervision data, whether the number of times of occurrence during a predetermined time period is larger than predetermined number or not is judged (S207). When the number of times of occurrence during a predetermined time period is more than predetermined number, an error display is carried out to the operator terminal unit 2A and the engineer's PC6 (S208). On the other hand, when the number of times of occurrence during a predetermined time period is less than the predetermined number, without applying the abnormality detection, the process is brought to completion.

When the apparatus alarm data do not coincide with the increased supervision data, whether default registration is applied to the increased supervision data setting file 14c or not is judged (S209). When the default registration is not applied, without applying the abnormality detection, the process is brought to completion. On the other hand, when the default registration is applied, whether the number of times of occurrence during a predetermined time period is more than the default-set number or not is judged (S210). When the number of times of occurrence during a predetermined time period is more than the default-set number, an error display is carried out to the operator terminal unit 2A and the engineer's PC6 (S211). On the other hand, when the number of times of occurrence during a predetermined time period is less than the default-set number, without applying the abnormality detection, the process is brought to completion. Thus, the apparatus alarm data can be used to detect the abnormality.

Since the abnormality of the apparatus alarm data can be detected in real time, the abnormality of the semiconductor manufacturing apparatus and process that become a reason of mass production of faulty wafers can be discovered earlier.

In the embodiment 1, by use of the past data stored in the past data memory 4a, an average value and a standard deviation are calculated, and with the calculated average value and standard deviation, upper and lower limit values are set to detect an abnormality. Thus, by use of a logic where an average value and a standard deviation are calculated from the past data and therefrom upper and lower limit values are obtained, an analysis simulator can be constituted as well. That is, when an engineer sets upper and lower limit values, the upper and lower limit values can be optimized with difficulty. However, when the above-mentioned analysis simulator is used, when detection conditions and the apparatus log data are selected, a detection rate and a misinformation rate are instantaneously simulated and thereby setting conditions can be optimized.

(Embodiment 2)

In an embodiment 2, the abnormality detection system described in the embodiment 1 is specifically applied to an exposure unit (stepper). An exposure unit is used in a manufacturing process of a semiconductor integrated circuit device containing a MOS (Metal Oxide Semiconductor) transistor and, for instance, in a process of forming on a wafer a wiring and a gate electrode of a MOS transistor. That is, in order to process the wiring and the gate electrode, the exposure unit is used in the process of patterning a resist film coated on a semiconductor wafer. When a process of forming a gate electrode is taken specifically as an example, on a wafer on which a gate insulating film is formed, an electrically conductive film made of, for instance, a polysilicon film is formed. Then, on the electrically conductive film, a resist film is coated. Subsequently, an exposure unit is used when the coated resist film is subjected to patterning. An exposure unit in the embodiment 2 is used, for instance, to pattern a resist film that is used to process a gate electrode.

Figure 29:
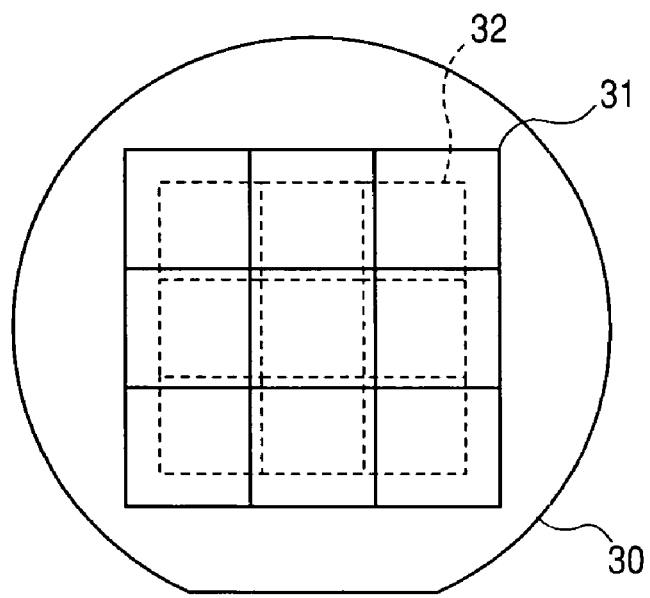
FIG. 29 schematically shows, in an embodiment 2, a misalignment between an underlayer pattern of a wafer actually measured with an exposure device and an ideal lattice that the exposure device has in the device.

In FIG. 29, an underlayer pattern 31 of a wafer 30 actually measured with an exposure unit and an ideal lattice 32 that the exposure unit has in the unit are schematically shown. As shown in FIG. 29, the exposure unit has a function of correcting a misalignment in the exposure unit when a misalignment is caused between the measured underlayer pattern 31 and the ideal lattice 32. For instance, in order to print a pattern with precision to the underlayer pattern 31, a global alignment process is applied.

However, when a mismeasurement occurs in the global alignment process, though the underlayer pattern is not misaligned actually, a virtual misalignment is corrected to expose. In this case, a faulty wafer where a printing pattern and the underlayer pattern are misaligned from each other is caused. Accordingly, in an ordinary semiconductor manufacturing factory, one wafer is sampled from wafers of one lot or one batch and a sampling inspection is applied thereto. However, since the global alignment process is applied every time when a wafer is processed, it is likely that the mismeasurement of the global alignment may randomly occur on a wafer base. Accordingly, according to the sampling inspection, it is difficult to detect an abnormality in the global alignment process.

In the global alignment process, global alignment measurement data (positional alignment measurement data) that show an amount of misalignment between the underlayer pattern 31 and the ideal pattern 32 are outputted as apparatus log data from the exposure unit. In this connection, in the embodiment 2, the global alignment measurement data are used to detect an abnormality. It is confirmed that, when the exposure unit misdetects a false misalignment between the underlayer pattern 31 and the ideal pattern 32, a sudden jump is generated in the global alignment measurement data that are apparatus log data. Accordingly, when whether a sudden jump is generated in the global alignment measurement data or not is detected, an off-specification wafer can be found in an early stage.

Figure 30:
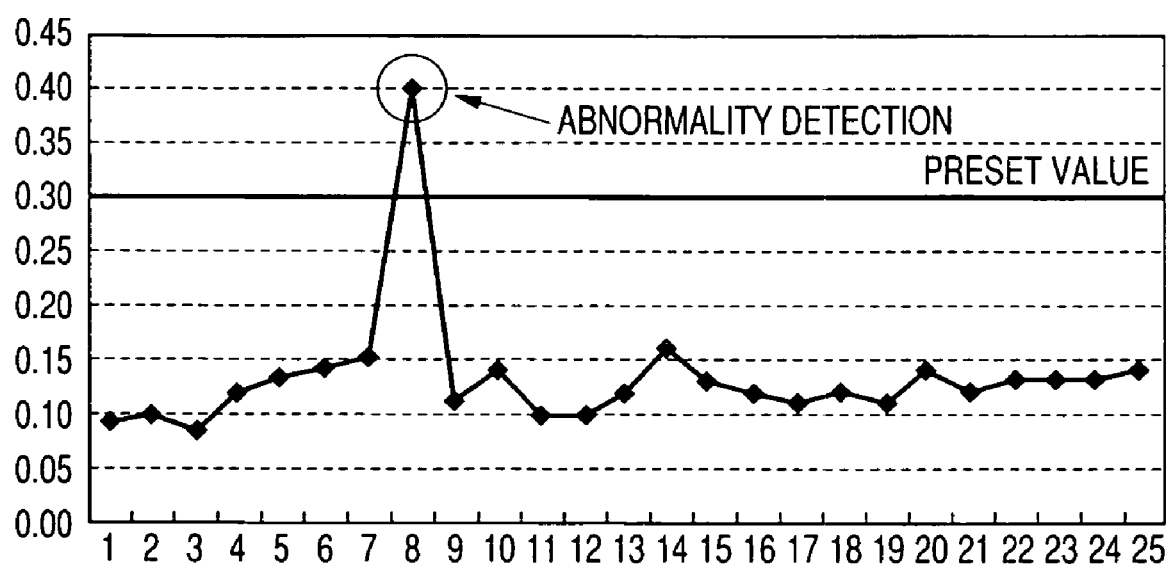
FIG. 30 is a diagram showing a situation when a sudden abnormality occurred in AGA measurement data.

In FIG. 30, a situation where a sudden abnormality occurs in the global alignment measurement data is specifically shown. A horizontal axis shows a wafer No and a vertical axis shows global alignment measurement data that are apparatus log data. As obvious from FIG. 30, values of almost all global alignment measurement data are present between [0.10] and [0.15]. However, a global alignment measurement datum corresponding to wafer No [8] suddenly jumps to a value of [0.40]. At this time, since [0.30] is taken as a threshold value, the global alignment measurement datum corresponding to wafer No [8] is detected as abnormal. Accordingly, according to the embodiment 2, a wafer that is off-specification due to the pattern misalignment can be specified and detected. In the wafer where an abnormality is detected, a resist film where a misaligned pattern is transcribed is removed, a resist film is newly coated, followed by once more exposing and developing, and thereby a normal pattern is formed. Thus, a wafer where the abnormality was detected can be recovered.

Furthermore, a plurality of exposure units are connected to the abnormality detection system that is used in a manufacturing method of the semiconductor integrated circuit device in the embodiment 2. However, in the connected plurality of exposure units, the abnormality does not necessarily occur similarly and there is a case where when a particular product is produced with a particular exposure unit the abnormality occurs frequently. A combination of such exposure unit and product can be specified when the abnormality detection is continued with the abnormality detection system. Accordingly, when, to a combination of the specified exposure unit and a product manufactured therewith, apparatus conditions and processing conditions are optimized, the abnormality can be suppressed from occurring.

(Embodiment 3)

An embodiment 3 is one in which the abnormality detection system described in the foregoing embodiment 1 is specifically applied to an etching unit. The etching unit is a unit that etches a wafer and a film formed on the wafer and used in a manufacturing process of a semiconductor integrated circuit device containing a MOS transistor. For instance, the etching unit is used when an element isolation groove for electrically isolating elements such as MOS transistors is formed on a wafer. Specifically, a silicon oxide film and a silicon nitride film are sequentially formed on a wafer followed by patterning by use of a photolithography method to form an element isolation region. The patterning is carried out so that a silicon oxide film and a silicon nitride film formed in a region where an element isolation region is formed may be removed. Then, with the patterned silicon oxide film and silicon nitride film as a mask, by use of an etching unit, exposed silicon is etched to form an element isolation groove. Thereafter, in the element isolation groove formed by etching, a silicon oxide film is buried to form an element isolation region. In the embodiment 3, an etching unit is used in, for instance, a process of forming an element isolation groove such as mentioned above.

Figure 31:
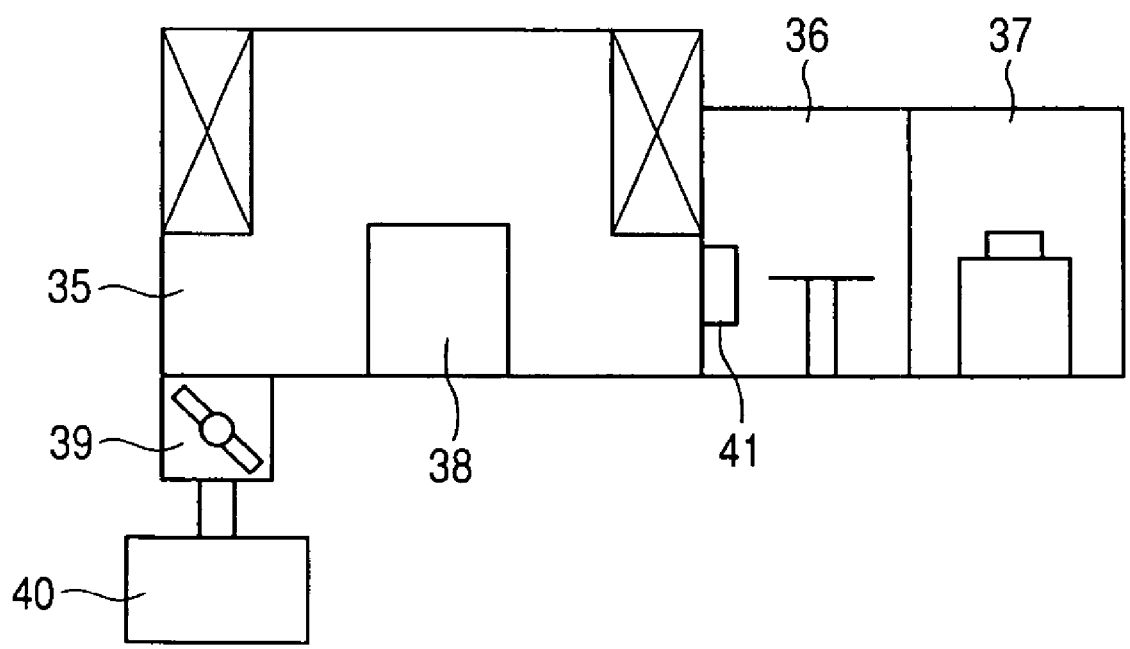
FIG. 31 is a diagram showing a configuration of an etching unit in embodiment 3.

FIG. 31 is a diagram showing a schematic configuration of the foregoing etching unit. In FIG. 31, the etching unit includes an etching chamber 35, a transfer chamber 36, a load lock chamber 37, a stage 38, an APC (Auto Pressure Control) valve 39, a pump 40 and a gate valve 41.

The etching chamber 35 is a chamber where an etching operation is carried out and inside thereof a stage 38 for disposing wafers thereon is disposed. The stage 38 combines a function as an electrode. Furthermore, the etching chamber. 35 is connected through the APC valve 39 to the pump 40.

The APC valve 39 is disposed to control pressure inside of the etching chamber 35 and an aperture thereof can be controlled. The aperture is outputted as the apparatus log data from the etching unit. Furthermore, the pump 40 is disposed to evacuate a gas inside of the etching chamber 35.

The gate valve 41 is a valve that can open and close between the etching chamber 35 and the transfer chamber 36, and has an O-ring.

In thus configured etching unit, a wafer is etched in such a manner that with a wafer disposed on a stage 38, an etching gas is introduced inside of the etching chamber 35 to etch. At this time, the APC valve 39 is set at a predetermined aperture and a reaction gas due to the etching is evacuated outside through the APC valve 39. Specifically, an etching process that is carried out in the etching unit is a process for forming, for instance, an element isolation groove for isolating elements on a wafer.

When an etching operation is carried out in the etching chamber 35, the gate valve 41 disposed between the etching chamber 35 and the transfer chamber 36 is closed. However, when the O-ring in the gate valve 41 is deteriorated, even when the gate valve 41 is closed, leakage is caused. That is, a nitrogen gas present in the transfer chamber 36 leaks into the etching chamber 35 lower in the pressure than the transfer chamber 36. Thereby, the pressure in the etching chamber 35 goes up. Accordingly, in order to lower the pressure in the etching chamber 35, the aperture of the APC valve 39 becomes larger.

When the aperture of the APC valve 39 becomes larger, an etching gas present in the etching chamber 35 is more evacuated. Accordingly, an etching reaction is relatively reduced, a depth of an element isolation groove formed on a wafer becomes shallower and, as a result, a faulty product is generated.

In this connection, in the embodiment 3, by use of the aperture of the APC valve 39 as the apparatus log data a process abnormality based on the malfunction of the etching unit is detected. That is, when the aperture of the APC valve becomes larger, the abnormality is detected as that nitrogen leaks into the etching chamber 35.

Figure 32:
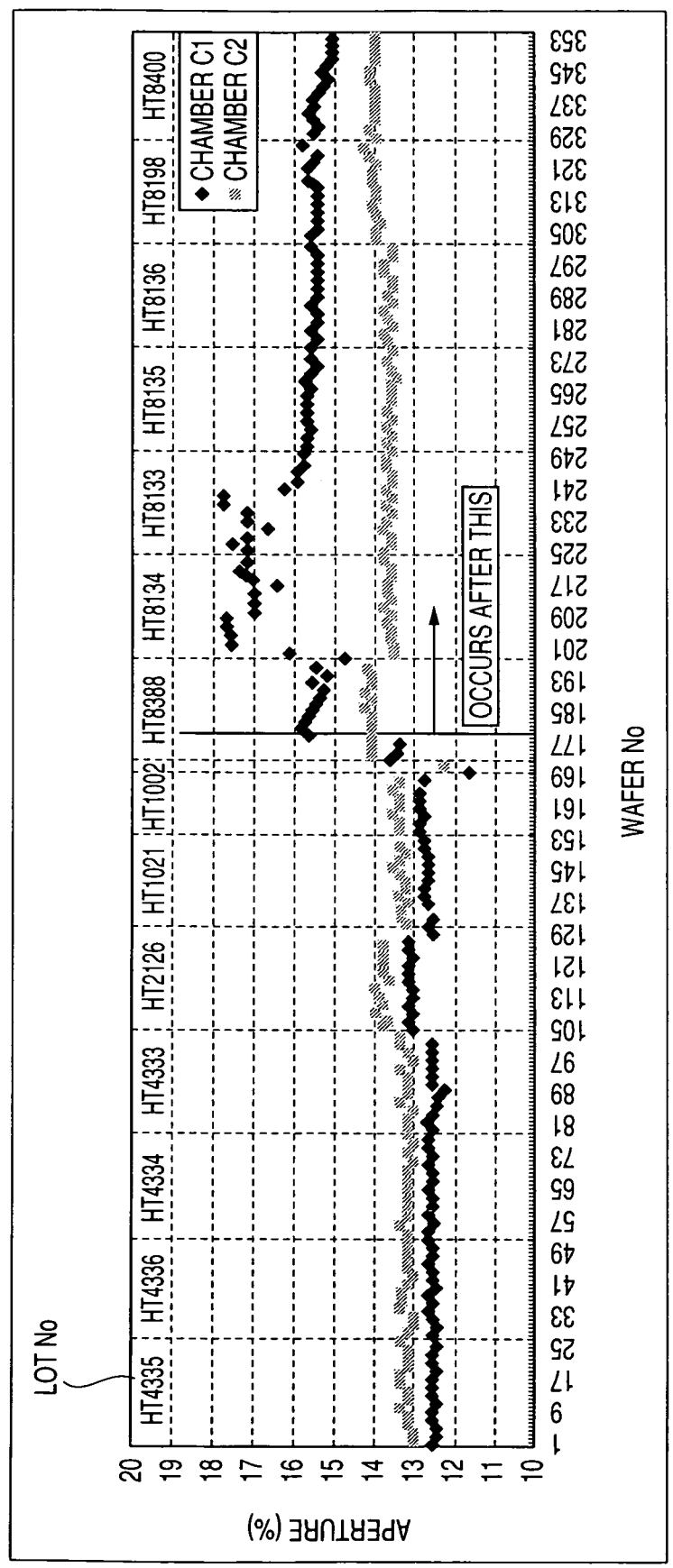
FIG. 32 is a diagram showing a relationship between wafer No and an aperture of an APC valve.

In FIG. 32, a relationship between a wafer No of a wafer that is etched and an aperture of the APC valve 39 that is the apparatus log data is shown. A horizontal axis shows a wafer No and a vertical axis shows an aperture (%) of the APC valve 39. In FIG. 32, data are shown of independent separate two etching chambers C1 and C2.

As obvious from FIG. 32, the aperture of the etching chamber C2 remains stable in the range of [13%] to [14%]. On the other hand, the aperture of the etching chamber C1, while remaining stable in the range of [12%] to [13%] between wafer Nos [1] through [about 180], suddenly goes up around wafer No [about 180] to the range of [15%] to [16%]. Thereafter, around wafer Nos [about 200] through [about 240], the aperture becomes in the range of [17%] to [18%], followed by remaining in the range of [15%] to [16%]. Accordingly, when a threshold value for detecting an abnormality of the aperture is set at [15%] for instance, a first increase in the aperture can be detected as abnormal.

When the aperture abnormality is detected, when an operator checks whether the leakage is actually caused or not, faulty wafers can be inhibited in advance from producing a lot thereof.

(Embodiment 4)

In the embodiment 4, the abnormality detection system described in the embodiment 1 is specifically applied to a plasma CVD (Chemical Vapor Deposition) unit. The plasma CVD unit is a unit in forming a film on a wafer and is used in a process of manufacturing a semiconductor integrated circuit device including a MOS transistor. For instance, after an element such as a MOS transistor is formed on a wafer, the plasma CVD unit is used to form an interlayer insulating film on the MOS transistor. The interlayer insulating film can be formed by depositing, after the MOS transistor is formed on the wafer, a silicon oxide film on the MOS transistor by use of a plasma CVD unit. Specifically, a silicon oxide film that becomes an interlayer insulating film can be formed with for instance TEOS (Tetra Ethyl Ortho Silicate) as a raw material. The plasma CVD unit in the embodiment 4 is used in a process of forming for instance the interlayer insulating film such as mentioned above.

Figure 33:
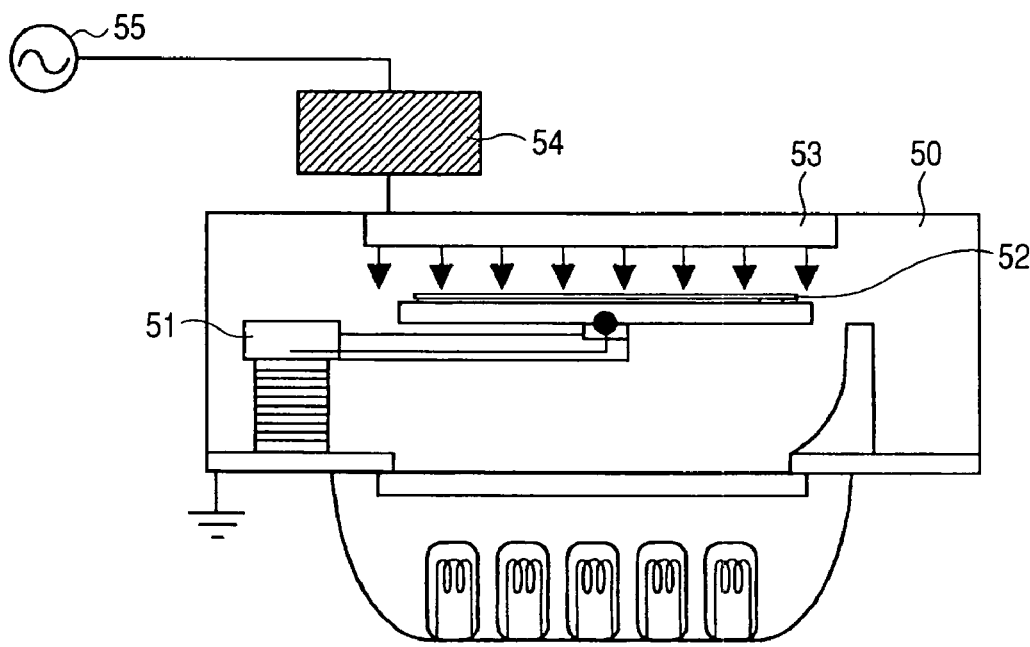
FIG. 33 is a diagram showing a configuration of a plasma CVD unit in an embodiment 4.

FIG. 33 is a diagram showing a schematic configuration of the plasma CVD unit. In FIG. 33, the plasma CVD unit includes a chamber 50, a lower electrode (susceptor) 51, an upper electrode 53, a matcher (functional portion) 54, and an RF (Radio Frequency) power source 55.

On the lower electrode 51, a wafer 52 on which a layer is formed is disposed. The upper electrode 53 is formed into a shower electrode and can introduce a plasmatized gas into the chamber 50.

Furthermore, the matcher 54 is disposed between the chamber 50 and the RF power source 55. The matcher 54 is disposed to establish impedance matching. The RF power source 55 is constituted so as to be able to generate a high-frequency voltage of, for instance, 13.56 MHz.

When the matcher 54 operates normally, an RF reflection wave is not outputted. However, when the matcher 54 is continued to use and deteriorated, the RF reflection wave is outputted from the matcher 54 and an output power of the RF reflection wave gradually increases. When the RF reflection wave is thus outputted from the matcher 54, the RF power source 55 connected to the matcher 54 is adversely affected, resulting in causing a malfunction of the RF power source. Accordingly, in the plasma CVD unit, when an average value of the RF reflection wave outputted from the matcher 54 exceeds 20 W and the state continues for 5 sec, owing to an interlock function of the plasma CVD unit, an output of the RF power source 55 is shut down. When the interlocking is operated like this, in the middle of the deposition process of a wafer, the output of the RF power source 55 is shut down. Accordingly, a film thickness of a film on the wafer does not reach a specified value and a wafer scrap results.

In this connection, in the embodiment 4, an average value of the RF reflection wave is used as the apparatus log data, and thereby before the plasma CVD unit applies interlocking the abnormality of the matcher 54 is detected. That is, the average value of the RF reflection wave is always supervised to inhibit in advance the wafer scrap from being formed.

Figure 34:
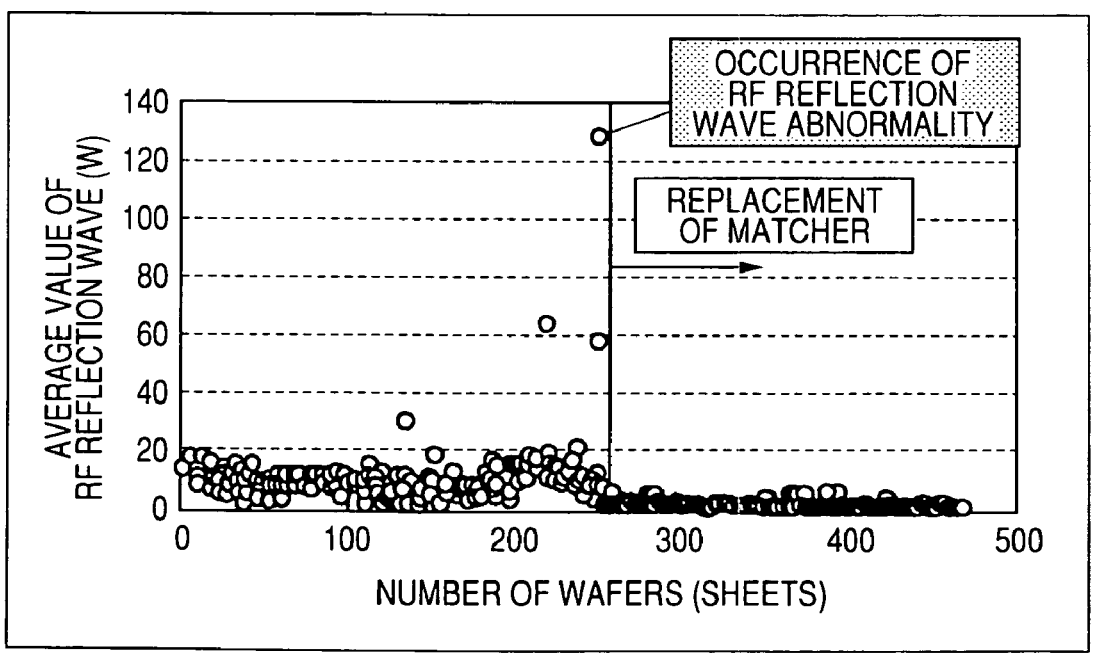
FIG. 34 is a diagram showing a relationship between the number of wafers and an average value of RF reflection waves.

In FIG. 34, a trend of the average value of the RF reflection wave when the abnormality occurs in the matcher 54 is shown. A horizontal axis shows the number of wafers and a vertical axis shows an average value of the RF reflection wave. As obvious from FIG. 34, until the number of processed wafers reaches substantially 120 wafers, an average value of the RF reflection wave outputted from the matcher 54 is 20 W or less, and around 120 of the number of processed wafers the average value of the RF reflection wave temporarily exceeds 20 W to be 30 W. Thereafter, the average value of the RF reflection wave returns again within 20 W. However, around 220 of the number of the processed wafers, the average value of the RF reflection wave temporarily exceeds 60 W. Then, around 250 of the number of the processed wafers, an output of the RF reflection wave exceeds 120 W, the system applies the interlocking, resulting in causing a fault of the matcher 54. Thereafter, when the matcher 54 is replaced, the RF reflection wave is hardly outputted.

As shown in FIG. 34, as the matcher 54 gradually deteriorates, even before the interlocking is applied owing to the system, in some cases, an average value of the RE reflection wave outputted from the matcher 54 temporarily (without continuing for 5 sec) exceeds 20 W. Accordingly, when a threshold value with which the abnormality of the average value of the RF reflection wave is judged is set at, for instance, 30 W exceeding 20 W based on a standard deviation calculated from the past data as mentioned above in the embodiment 1, at a stage before substantially 250 of the processed wafers at which the system interlocks, the abnormality of the matcher 54 can be detected. That is, in a method where, with a case when an output of an average value of the reflection wave equal to or more than 20 W continuously continues for 5 sec as a condition, the system interlocks, when the abnormality of 20 W or more occurs in the average value of the reflection wave, the matcher 54 is judged defective, thereby the power source is stopped, and a wafer in process becomes a scrap. On the other hand, in the embodiment 4, before the abnormality to an extent that causes the stoppage of the power source is generated, a precursory abnormality is detected to remove a wafer scrap. That is, according to the abnormality detection system of the embodiment 4, without causing the shutdown of the power source of the unit, a slight abnormality is detected; accordingly, a wafer in process can be relieved.

In the foregoing description, an example where the interlocking is applied when the output exceeds 20 W continuously for 5 sec is described; however, the condition may be altered. However, in this case, the interlocking is determined when the system is manufactured and cannot be altered. Furthermore, when the interlocking is used to detect, since the system power source is shut down and the wafer cannot be recovered, a wafer scrap is generated. Accordingly, it is found that the abnormality detection system according to the embodiment 4 where without causing shutdown of the system power source a precursory slight abnormality is detected to relieve a wafer is effective.

Furthermore, there is one in which the interlocking can be set. However, in a case where small amounts of products of many kinds are manufactured, since many settings have to be appropriately carried out, a setting operation is difficult. On the other hand, in the embodiment 4, as described in the embodiment 1, the past data are used to automatically set an appropriate threshold value; accordingly, an appropriate threshold value can be conveniently set.

Thus, according to the abnormality detection system of the embodiment 4, when an average value of the RF reflection wave that is the apparatus log data is supervised, the abnormality of the matcher 54 can be discovered in an early stage. Accordingly, the wafer scrap can be inhibited in advance from occurring and a timing when the matcher 54 is exchanged can be optimized. Furthermore, since the matcher 54 can be used continuously in a normal state where the RF reflection wave is less, the service life of the RF power source 54 that is connected to the matcher 54 can be lengthened.

(Embodiment 5)

In an embodiment 5, the abnormality detection system described in the embodiment 1 is specifically applied to a CVD (Chemical Vapor Deposition) unit. The CVD unit is a unit with which a film is formed on a wafer and used in a manufacturing process of a semiconductor integrated circuit device including a MOS transistor. The CVD unit is used for instance to bury a tungsten film in a contact hole to form a plug. Specifically, after an element such as a MOS transistor is formed on a wafer, on the MOS transistor, an interlayer insulating film is formed. Then, by use of a photolithography technique and the etching technology, a contact hole is formed in the interlayer insulating film, followed by forming a titanium/titanium nitride film in the contact hole by use of the sputtering method. Thereafter, a tungsten film is buried in the contact hole by use of the CVD unit to form a plug. In the embodiment 5, the CVD unit is used in a process of forming the plug as mentioned above.

Figure 35:
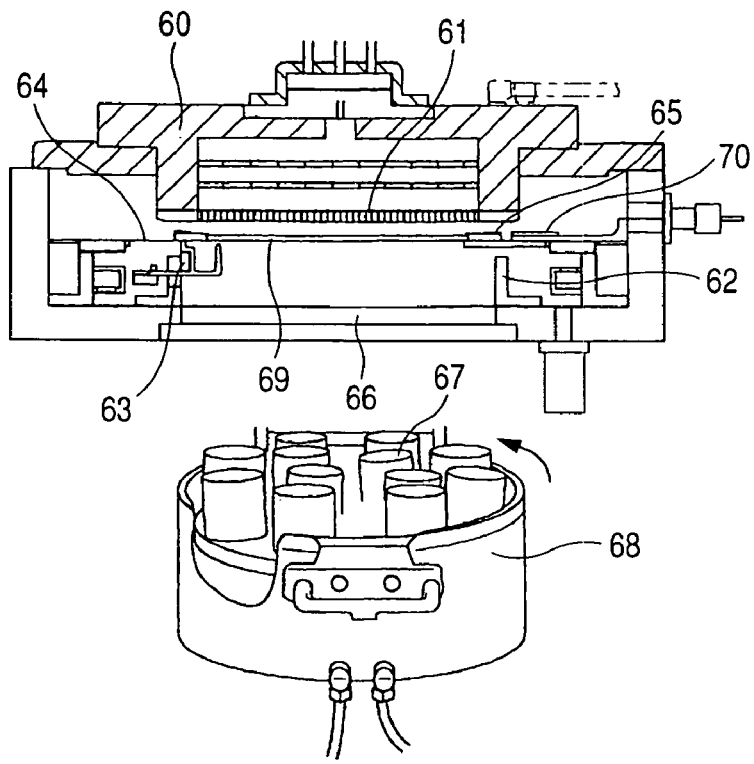
FIG. 35 is a diagram showing a configuration of a CVD unit in an embodiment 5.

FIG. 35 is a diagram showing a schematic configuration of the CVD unit. In FIG. 35, the CVD unit includes a shower base 60, a showerhead 61, a reflector 62, a lifter pin 63, an attachment 64, a clamp ring 65, a quartz window 66, lamps 67, a lamp house 68, a susceptor 69 and a thermocouple 70.

In the CVD unit, a wafer is disposed on the susceptor 69 and fastened thereto with the clamp ring 65. The wafer is heated by use of lamps 67 disposed under the quartz window 66. A plurality of lamps 67 used to heat are housed in the lamp house 68. A wafer temperature is controlled with the thermocouple 70 connected to the susceptor 69. On an internal surface of the lamp house 68, gold plating (component) is applied to improve the reflectance. Furthermore, a raw material gas is introduced from the showerhead 61 on the wafer to form a film.

The wafer is heated with a plurality of lamps 67 housed in the lamp house 68. The lamps 67 are normally operated at a power of substantially 40 to 50% relative to the maximum lamp power. However, when a lamp 67 that does not operate normally owing to the lifetime is generated in the lamps 67 housed in the lamp house 68, so as to compensate a decrease in the output of the lamp, powers of other lamps 67 in the proximity thereof go up. When the power of the lamp 67 goes up, the consumption current increases to generate a fault where an eddy current is generated and thereby the system power source is shut down. Furthermore, the eddy current is caused as well by the clouding of the quartz window 66 and the short-circuiting of a part of the lamps 67.

When the power of the lamp 67 goes up, there are caused various problems in that a gold plating formed on an internal surface of the lamp house 68 is melted to cause a defect of the lamp house 68, a film quality is varied owing to a rise of the lamp power and a wafer in process becomes a scrap when the system power source is shut down.

In this connection, in the embodiment 5, the power of the lamp 67 is used as the apparatus log data to detect an abnormality of the lamp 67 before the system power source is shut down. That is, the power of the lamp 67 is always supervised, and thereby a wafer scrap can be inhibited in advance from occurring.

Figure 36:
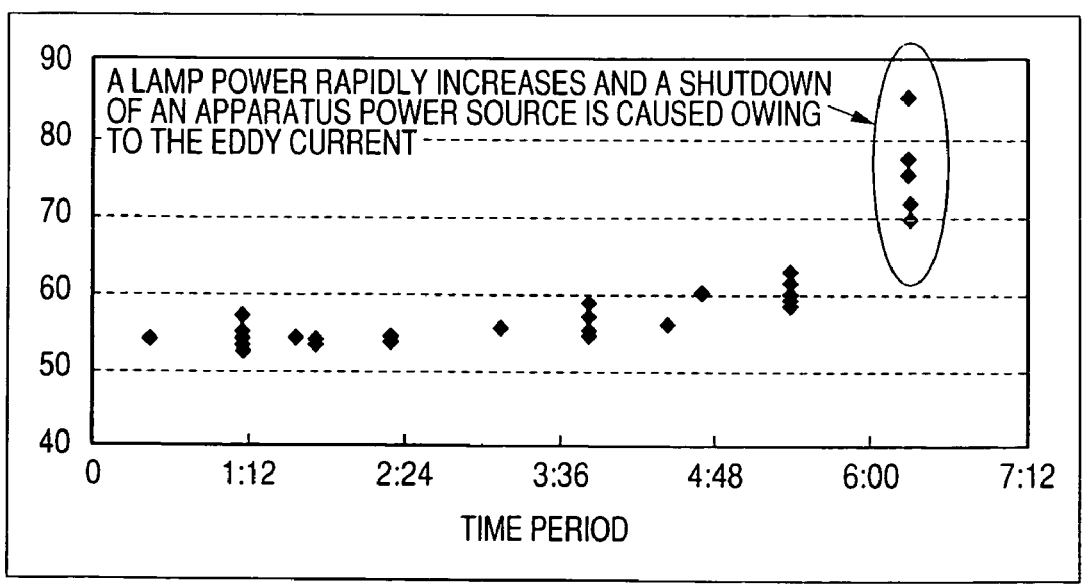
FIG. 36 is a diagram showing a relationship between a time period and a lamp power.

FIG. 36 is a diagram showing a trend of a power (ratio to maximum lamp power) of the lamp 67 when a trouble occurs. A horizontal axis shows a time period and a vertical axis shows. a power of the lamp 67. In FIG. 36, of the lamps 67 housed in the lamp house 68, powers of 5 lamps are simultaneously described.

As obvious from FIG. 36, it is found that until around 3 hr and 36 min elapses, the powers of the lamps 67 are in the range of 50 to 60%, after that, the powers of the lamps 67 gradually go up to exceed a line of 60%, and, in the proximity of exceeding 6 hr, the powers of the lamps 67 rapidly go up to an extent that enters in the range of 70 to 90%. In the time when the powers of the lamps 67 rapidly go up, the shutdown of the system power source due to the eddy current is caused.

Before the powers of the lamps 67 rapidly go up, the powers of the lamps 67 gradually go up. Accordingly, when a threshold value for judging the power abnormality of the lamp 67, as mentioned in the embodiment 1, based on a standard deviation calculated from the past data, is set at for instance 60%, in a stage before the system power source goes down, a slight abnormality in the power of the lamp 67 can be detected. Thus, according to the abnormality detection system of the embodiment 5, when the power of the lamp 67 that is the apparatus log data is supervised, the power abnormality of the lamp 67 can be discovered early.

Accordingly, the wafer scrap owing to the shutdown of the system power source can be inhibited in advance from occurring and the lamp house 68 can achieve a longer lifetime. That is, according to the abnormality detection system of the embodiment 5, without causing shutdown of the system power source, a slight abnormality can be detected; accordingly, a wafer in process can be relieved.

Here, an interlock is considered to use, however, in the interlock, the system power source is shut down to generate a scrap of a wafer in process and since many settings have to be appropriately carried out like in a case where a wide variety of products are manufactured in small quantities, it is difficult to set. On the other hand, in the embodiment 5, without causing the shutdown of the system power source, a precursory slight abnormality is detected to relieve a wafer, and, as described in the embodiment 1, since the past data can be used to automatically set an appropriate threshold value, an appropriate threshold value can be conveniently set.

Furthermore, although a system alarm is considered to use, in the embodiment, a slight abnormality before the system alarm is given forth can be detected; accordingly, an abnormality can be detected early.

A manufacturing method of a semiconductor integrated circuit device according to the invention can be widely used in a manufacturing industry that manufactures a semiconductor integrated circuit device.

In the above, the invention achieved by the inventors is specifically described based on the embodiments. However, it goes without saying that the invention is not restricted thereto and various modifications can be applied within a range that does not deviate from a gist of the invention.

What is claimed is:

1. A manufacturing method of a semiconductor integrated circuit device, comprising:
    (a) storing apparatus log data that are data outputted from semiconductor manufacturing apparatus that processes a semiconductor wafer, contain a plurality of headers and show a state of the semiconductor manufacturing apparatus in an apparatus log data memory;
    (b) detecting whether there are abnormal data in the apparatus log data stored in the apparatus log data memory or not at an abnormal data detector; and
    (c) outputting a result detected at the abnormal data detector to a result output portion,
wherein the process (b) includes lower rank processes below:
    (b1) acquiring a search key assigning the header of the apparatus log data;
    (b2) extracting past data coinciding with the apparatus log data in a content of the header assigned with the acquired search key from a past data memory;
    (b3) calculating a standard deviation from the extracted past data; and
    (b4) detecting based on the calculated standard deviation whether the abnormal data are present in the apparatus log data or not,
wherein, of assignment of the header with the search key, an assignment of an apparatus name is grouped to enable to apply on a group base.

* * * * *